United States Patent
Ono et al.

(10) Patent No.: US 9,169,353 B2
(45) Date of Patent: Oct. 27, 2015

(54) SEALING COMPOSITION FOR SEMICONDUCTOR, SEMICONDUCTOR DEVICE AND METHOD OF PRODUCING THE SAME, AND POLYMER AND METHOD OF PRODUCING THE SAME

(71) Applicant: MITSUI CHEMICALS, INC., Minato-ku (JP)

(72) Inventors: Shoko Ono, Ichihara (JP); Yasuhisa Kayaba, Sodegaura (JP); Hirofumi Tanaka, Sodegaura (JP); Kazuo Kohmura, Iwakuni (JP); Tsuneji Suzuki, Chiba (JP); Shigeru Mio, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 14/372,237

(22) PCT Filed: Jan. 16, 2013

(86) PCT No.: PCT/JP2013/050686
§ 371 (c)(1),
(2) Date: Jul. 15, 2014

(87) PCT Pub. No.: WO2013/108791
PCT Pub. Date: Jul. 25, 2013

(65) Prior Publication Data
US 2014/0367868 A1    Dec. 18, 2014

(30) Foreign Application Priority Data
Jan. 17, 2012    (JP) ................. 2012-007151

(51) Int. Cl.
C08G 73/02    (2006.01)
H01L 23/29    (2006.01)
(Continued)

(52) U.S. Cl.
CPC ........ *C08G 73/0206* (2013.01); *C08G 73/0213* (2013.01); *C08G 73/0226* (2013.01);
(Continued)

(58) Field of Classification Search
None
See application file for complete search history.

(56) References Cited

U.S. PATENT DOCUMENTS 6,288,197 B1    9/2001    Youngs et al.
8,502,401 B2 *  8/2013    Burgoyne et al. ............. 257/792
(Continued)

FOREIGN PATENT DOCUMENTS

JP    49-033120 B1    9/1974
JP    2002-513047 A   5/2002
(Continued)

OTHER PUBLICATIONS

International Search Report (PCT/ISA/210) mailed on Mar. 26, 2013, by the Japanese Patent Office as the International Searching Authority for International Application No. PCT/JP2013/050686.
(Continued)

*Primary Examiner* — Sonya D McCall Shepard
(74) *Attorney, Agent, or Firm* — Buchanan, Ingersoll & Rooney PC

(57) ABSTRACT

In the invention, a sealing composition for a semiconductor is provided which includes a polymer that includes two or more cationic functional groups including at least one of a tertiary nitrogen atom or a quaternary nitrogen atom, that has a weight average molecular weight of from 2,000 to 1,000,000, and that has a branching degree of 48% or more, wherein a content of sodium and a content of potassium in the sealing composition are each 10 ppb by weight or less on an element basis.

16 Claims, 4 Drawing Sheets

(51) Int. Cl.
*H01L 21/02* (2006.01)
*H01L 23/532* (2006.01)
*H01L 21/56* (2006.01)
*C09J 179/02* (2006.01)
*C09K 3/10* (2006.01)

(52) U.S. Cl.
CPC ............. *C09J179/02* (2013.01); *C09K 3/1006* (2013.01); *H01L 21/02118* (2013.01); *H01L 21/02126* (2013.01); *H01L 21/02203* (2013.01); *H01L 21/02282* (2013.01); *H01L 21/02304* (2013.01); *H01L 21/02362* (2013.01); *H01L 21/56* (2013.01); *H01L 23/293* (2013.01); *H01L 23/5329* (2013.01); *C08G 2190/00* (2013.01); *C09K 2003/1087* (2013.01); *H01L 2924/0002* (2013.01); *Y10T 428/2982* (2015.01)

(56) References Cited

U.S. PATENT DOCUMENTS

| | | | |
|---|---|---|---|
| 2001/0039328 | A1 | 11/2001 | Youngs et al. |
| 2005/0085404 | A1 | 4/2005 | Yoneda et al. |
| 2011/0180764 | A1 | 7/2011 | Takahashi et al. |

FOREIGN PATENT DOCUMENTS

| | | |
|---|---|---|
| JP | 2005-350640 A | 12/2005 |
| JP | 2006-352042 A | 12/2006 |
| JP | 2008-045024 A | 2/2008 |
| JP | 2009-503879 A1 | 1/2009 |
| JP | 2010-118168 A | 5/2010 |
| WO | WO 2009/012184 A1 | 1/2009 |
| WO | WO 2010/137711 A1 | 12/2010 |

OTHER PUBLICATIONS

Written Opinion (PCT/ISA/237) mailed on Mar. 26, 2013, by the Japanese Patent Office as the International Searching Authority for International Application No. PCT/JP2013/050686.

* cited by examiner

SEALING COMPOSITION FOR SEMICONDUCTOR, SEMICONDUCTOR DEVICE AND METHOD OF PRODUCING THE SAME, AND POLYMER AND METHOD OF PRODUCING THE SAME

TECHNICAL FIELD

The present invention relates to a sealing composition for a semiconductor, a semiconductor device and a method of producing the semiconductor device, and a polymer and a method of producing the polymer.

BACKGROUND ART

In the semiconductor device field in which scaling is advanced, various kinds of low dielectric constant materials (hereinafter, referred to as "low-k materials" in some cases) having a porous structure have been investigated as an interlayer dielectric layer of semiconductor.

If the porosity of the semiconductor interlayer dielectric layer having a porous structure is increased in order to further lower the dielectric constant thereof, metal components such as copper, which is embedded as a wiring material, or plasma components (at least one of radical or ion, the same shall apply hereinafter) caused by plasma treatment are prone to enter into the pores in the semiconductor interlayer dielectric layer, and thus the dielectric constant thereof increases or leakage current occurs in some cases.

In addition, metal components or plasma components diffuse even into a non-porous interlayer dielectric layer in some cases, and thus dielectric constant increases or leakage current occurs in the same manner as in a porous interlayer dielectric layer in some cases.

Meanwhile, a technique is known in which pores on the side wall surface of a groove formed by etching is sealed using a surfactant in a micelle state in wet cleaning after etching in a production method of semiconductor device using a porous low dielectric constant material (for example, see Japanese National-Phase Publication (JP-A) No. 2009-503879).

In addition, a technique is known in which the hydrophilicity and hydrophobicity of a low-k material is controlled by applying a polyvinyl alcohol-based amphiphilic polymer on the surface of the low-k material in a case in which the low-k material has a hydrophobic surface (for example, see International Publication No. WO 09/012184).

Moreover, a composition for semiconductor polishing containing a cationic polymer and a surfactant is known (for example, see Japanese Patent Application Laid-Open (JP-A) No. 2006-352042).

DISCLOSURE OF INVENTION

Technical Problem

In the technique disclosed in JP-A No. 2009-503879 above, there is a case in which a surfactant having no micelle structure enters into a pore in the side wall surface of a groove, and thus the relative dielectric constant increases. In addition, there is a case in which adhesion between the interlayer dielectric layer and the wiring material is deteriorated by a micelle.

In addition, in the technique disclosed in WO 09/012184 above, a bulky layer is prone to be formed by hydrogen bonding between the polyvinyl alcohol-based amphiphilic polymers, and by virtue of this, the relative dielectric constant of the interlayer dielectric layer increases in some cases or the adhesion between the interlayer dielectric layer and the wiring material deteriorates in some case.

In addition, a sealing composition for a semiconductor exhibiting a superior sealing property with respect to an interlayer dielectric layer is desired in some cases.

Accordingly, an object of the invention is to provide a sealing composition for a semiconductor excellent in a sealing property with respect to an interlayer dielectric layer, a semiconductor device in which the sealing composition for a semiconductor is used and a method of producing the semiconductor device, and a polymer suitable for the sealing composition for a semiconductor and a method of producing the polymer.

Solution to Problem

The inventors have conducted intensive investigations, and as a result thereof, have found out that a sealing property with respect to an interlayer dielectric layer is significantly improved by adjusting the branching degree in a specific polymer to a certain value or higher, thereby completing the invention.

In other words, the concrete means for solving the problems is as follows.

<1> A sealing composition for a semiconductor, comprising a polymer that includes two or more cationic functional groups including at least one of a tertiary nitrogen atom or a quaternary nitrogen atom, that has a weight average molecular weight of from 2,000 to 1,000,000, and that has a branching degree of 48% or more, wherein a content of sodium and a content of potassium in the sealing composition are each 10 ppb by weight or less on an element basis.

<2> The sealing composition for a semiconductor according to <1>, wherein the polymer includes a structural unit that is derived from an alkyleneimine having from 2 to 8 carbon atoms and that includes a tertiary nitrogen atom as a cationic functional group.

<3> The sealing composition for a semiconductor according to <2>, wherein the polymer further includes a structural unit that is derived from an alkyleneimine having from 2 to 8 carbon atoms and that includes a secondary nitrogen atom as a cationic functional group.

<4> The sealing composition for a semiconductor according to any one of <1> to <3>, wherein the polymer includes primary nitrogen atoms, and a proportion of the primary nitrogen atoms to all the nitrogen atoms in the polymer is 33% by mole or more.

<5> The sealing composition for a semiconductor according to any one of <1> to <4>, wherein the branching degree of the polymer is 55% or more.

<6> The sealing composition for a semiconductor according to any one of <1> to <5>, wherein the sealing composition has an average particle diameter measured by a dynamic light scattering method of 150 nm or less.

<7> The sealing composition for a semiconductor according to any one of <1> to <6>, wherein the polymer is a polyethyleneimine or a derivative of a polyethyleneimine.

<8> The sealing composition for a semiconductor according to any one of <1> to <7>, wherein the polymer has a cationic functional group equivalent of from 27 to 430.

<9> A method of producing a semiconductor device, comprising a sealing composition application process of applying the sealing composition for a semiconductor according to any one of <1> to <8> to an interlayer dielectric layer formed on a substrate.

<10> The method of producing a semiconductor device according to <9>, wherein the interlayer dielectric layer includes a porous silica and has a silanol residue derived from the porous silica on a surface thereof.

<11> The method of producing a semiconductor device according to <9> or <10>, the method further comprising a process of forming a concave groove having a width of from 10 nm to 32 nm in the interlayer dielectric layer, wherein the sealing composition application process includes bringing the sealing composition for a semiconductor into contact with the interlayer dielectric layer at at least a side surface of the concave groove.

<12> A semiconductor device comprising a structure in which:
an interlayer dielectric layer;
a polymer layer containing a polymer that includes two or more cationic functional groups including at least one of a tertiary nitrogen atom or a quaternary nitrogen atom, that has a weight average molecular weight of from 2,000 to 1,000,000, and that has a branching degree of 48% or more; and
a layer including copper
are disposed in this order.

In the semiconductor device according to <12>, it is preferable that a copper barrier layer is further disposed between the polymer layer and the layer including copper. In addition, in the semiconductor device according to <12>, the interlayer dielectric layer is preferably a porous interlayer dielectric layer (that is, an interlayer dielectric layer having a porous structure).

<13> A polymer that comprises two or more cationic functional groups including at least one of a tertiary nitrogen atom or a quaternary nitrogen atom, that has a weight average molecular weight of from 2,000 to 1,000,000, and that has a branching degree of 48% or more.

<14> The polymer according to <13>, wherein the polymer is a polyethyleneimine or a derivative of a polyethyleneimine.

<15> A method of producing the polymer according to <13> or <14>, the method comprising a process of reacting a raw material polymer containing a secondary nitrogen atom with a compound represented by the following Formula (m-1):

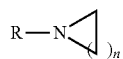

(m-1)

wherein, in Formula (m-1), R represents a protective group, and n represents an integer from 1 to 4.

Advantageous Effects of Invention

According to the invention, it is possible to provide a sealing composition for a semiconductor excellent in a sealing property with respect to an interlayer dielectric layer, a semiconductor device in which the sealing composition for a semiconductor is used and a method of producing the semiconductor device, and a polymer suitable for the sealing composition for a semiconductor and a method of producing the polymer.

DESCRIPTION OF EMBODIMENTS

<Sealing Composition for a Semiconductor>

Figure 1:
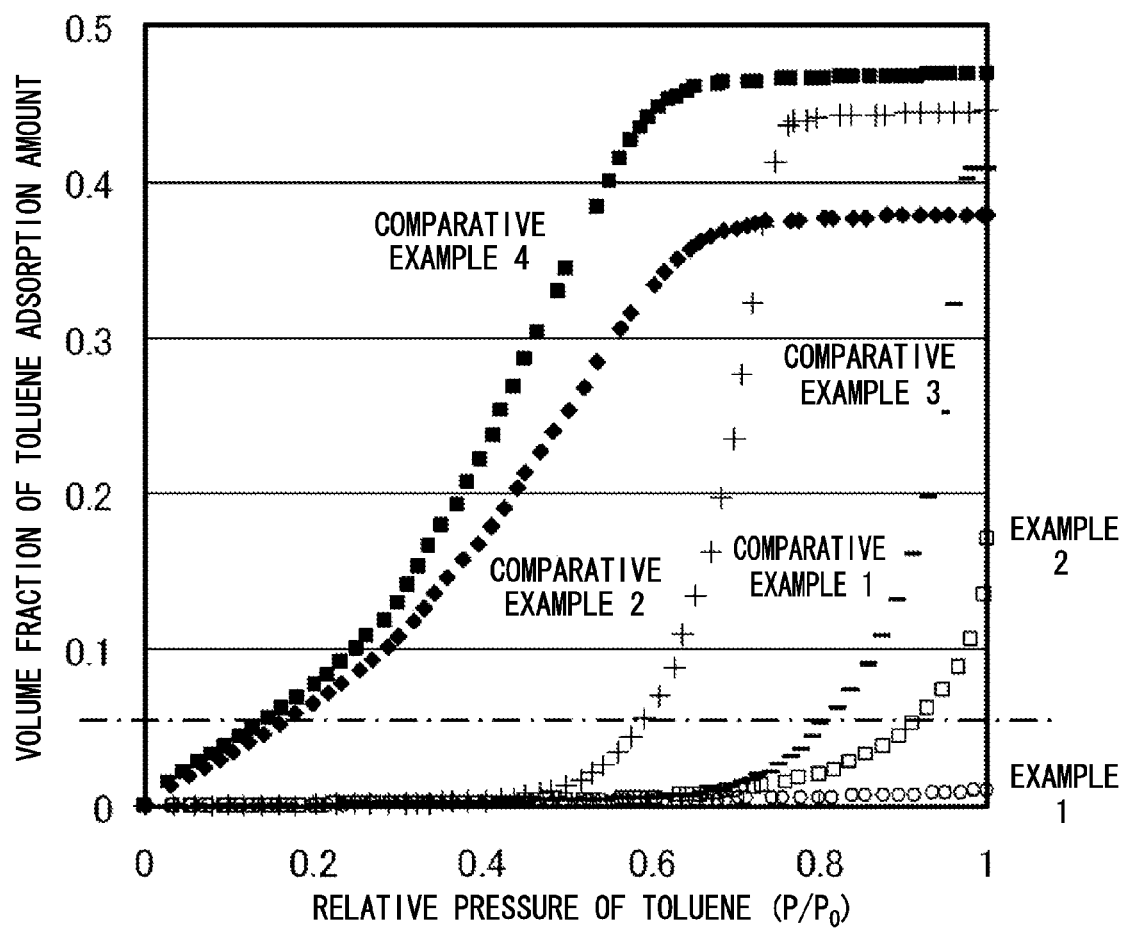
FIG. 1 is isothermal lines of toluene gas adsorption and desorption in Examples 1 and 2 and Comparative Examples 1 to 4.

The sealing composition for a semiconductor of the invention is used, for example, to form a polymer layer covering the surface of an interlayer dielectric layer (preferably, a polymer layer covering the pores formed on a porous interlayer dielectric layer), and includes a polymer including two or more cationic functional groups including at least one of a tertiary nitrogen atom or a quaternary nitrogen atom, having a weight average molecular weight of from 2,000 to 1,000,000, and having a branching degree of 48% or more. The content of sodium and the content of potassium in the composition are each 10 ppb by weight or less on an element basis.

If the sealing composition for a semiconductor of the constitution is applied to an interlayer dielectric layer, two or more cationic functional groups contained in the polymer are multipoint adsorbed on the interlayer dielectric layer. Hence, the surface (pores present on the porous interlayer dielectric layer in a case in which the interlayer dielectric layer is a porous interlayer dielectric layer) of the interlayer dielectric layer is covered with a polymer layer. By virtue of this, the diffusion of a metal component or a plasma component into an interlayer dielectric layer (particularly, a porous interlayer dielectric layer) can be suppressed (that is, excellent sealing property is exerted with respect to an interlayer dielectric layer). Moreover, since a polymer layer formed by the polymer is a thin layer (for example, 5 nm or less), adhesion between an interlayer dielectric layer and a wiring material formed on an interlayer dielectric layer via a polymer layer is excellent, and change in relative dielectric constant can be suppressed.

Particularly, in the sealing composition for a semiconductor of the invention, the two or more cationic functional groups includes at least one of a tertiary nitrogen atom or a quaternary nitrogen atom, and the branching degree of the polymer is 48% or more, and thus remarkably excellent sealing property is exhibited with respect to an interlayer dielectric layer (particularly, a porous interlayer dielectric layer). In other words, the diffusion of a metal component or a plasma component into an interlayer dielectric layer (particularly, a porous interlayer dielectric layer) can be significantly suppressed.

The reason for this is not clear, but it is presumed that if the branching degree of the polymer is high, the molecular chains having a branch structure are entangled with one another and thus the aperture between the molecular chains becomes small, and therefore, it can be efficiently prevented that a metal component or a plasma component passes through between the molecular chains.

Furthermore, in the sealing composition for a semiconductor of the invention, the two or more cationic functional groups contains at least one of a tertiary nitrogen atom or a quaternary nitrogen atom, and the branching degree of the polymer is 48% or more. Hence, the excellent sealing property of the composition with respect to an interlayer dielectric layer is preserved even in a case in which the composition is applied to an interlayer dielectric layer and then subjected to a heat treatment (for example, a heat treatment at from 200° C. to 425° C. (preferably from 200° C. to 400° C. and more preferably from 200° C. to 350° C.)). In other words, according to the sealing composition for a semiconductor of the invention, a polymer layer (sealing layer) excellent in heat resistance can be formed on an interlayer dielectric layer.

The reason for this is not clear, but it is presumed that the branching degree of the polymer is high, that is, the polymer is bulky, and thus thermal decomposition of the polymer and deterioration in sealing property due to the thermal decomposition are suppressed.

[Polymer]

The sealing composition for a semiconductor of the invention contains at least one kind of polymer (hereinafter, it is also referred to as the "polymer of the invention") including two or more cationic functional groups including at least one of a tertiary nitrogen atom or a quaternary nitrogen atom, having a weight average molecular weight of from 2,000 to 1,000,000, and having a branching degree of 48% or more.

In the invention, the term "branching degree" denotes a value obtained by the following Equation 1.

Branching degree (%)=((number of tertiary nitrogen atom+number of quaternary nitrogen atom)/(number of secondary nitrogen atom+number of tertiary nitrogen atom+number of quaternary nitrogen atom))×100     Equation 1

Accordingly, for example, in a case in which the polymer of the invention is a polyalkyleneimine, a linear polyalkyleneimine does not include any tertiary nitrogen atom or quaternary nitrogen atom, and thus the linear polyalkyleneimine is a polyalkyleneimine having a branching degree of 0%, and a polyalkyleneimine in which all the nitrogen atoms contained in the backbone moiety except the terminals are tertiary nitrogen atoms (that is, it is maximally branched) is a polyalkyleneimine having a branching degree of 100%.

In the invention, the term "primary nitrogen atom" denotes a nitrogen atom bonded only to two hydrogen atoms and one atom other than a hydrogen atom (for example, the nitrogen atom contained in a primary amino group (—NH$_2$ group)), or a nitrogen atom (cation) bonded only to three hydrogen atoms and one atom other than a hydrogen atom.

In addition, the term "secondary nitrogen atom" denotes a nitrogen atom bonded only to one hydrogen atom and two atoms other than a hydrogen atom (for example, the nitrogen atom contained in the functional group represented by the following Formula (a)), or a nitrogen atom (cation) bonded only to two hydrogen atoms and two atoms other than a hydrogen atom.

In addition, the term "tertiary nitrogen atom" denotes a nitrogen atom bonded only to three atoms other than a hydrogen atom (that is, the nitrogen atom of the functional group represented by the following Formula (b)), or a nitrogen atom (cation) bonded only to one hydrogen atom and three atoms other than a hydrogen atom.

In addition, the term "quaternary nitrogen atom" denotes a nitrogen atom (cation) bonded only to four atoms other than a hydrogen atom.

In the description above, the "atom other than a hydrogen atom" is not particularly limited and may be, for example, a carbon atom, a silicon atom, or the like, and a carbon atom is preferable.

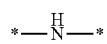

(a)

(b)

In Formulas (a) and (b), * represents a bonding position with an atom other than a hydrogen atom.

Here, the functional group represented by Formula (a) may be a functional group constituting part of a secondary amino group (—NHR$^a$ group; here, R$^a$ represents an alkyl group), or a divalent linking group contained in the backbone of a polymer.

In addition, the functional group (that is, a tertiary nitrogen atom) represented by Formula (b) may be a functional group constituting part of a tertiary amino group (—NR$^b$R$^c$ group; here, R$^b$ and R$^c$ each independently represent an alkyl group), or a trivalent linking group contained in the backbone of a polymer.

The branching degree of the polymer is required to be 48% or more. From the viewpoint of improving the sealing property, the branching degree is preferably 55% or more, more preferably 70% or more, and particularly preferably 75% or more.

The upper limit of the branching degree of the polymer is not particularly limited, and the branching degree is less than 100% in a case in which the polymer contains a secondary nitrogen atom. The branching degree of the polymer is preferably 95% or less from the viewpoint of easiness of synthesis.

The method of adjusting the branching degree to 48% or more is not particularly limited. For example, there is a method in which the branching degree is adjusted by the polymerization condition of monomer itself when a polymer is synthesized, or a method in which a primary nitrogen atom or a secondary nitrogen atom contained in a polymer is reacted with another nitrogen-containing compound or an alkyl compound, and thus a tertiary nitrogen atom or a quaternary nitrogen atom is generated from the primary nitrogen atom or the secondary nitrogen atom, thereby increasing the branching degree. A concrete example of the latter method will be described as a "method of producing a polymer" below.

In addition, the polymer of the invention preferably includes a structural unit including a cationic functional group (a structural unit derived from a monomer including a cationic functional group). In this case, the structure of the polymer may be a structure formed by the polymerization of a monomer including a cationic functional group in a linear shape, or a structure formed by the polymerization of a monomer including a cationic functional group in a branched shape.

The "cationic functional group" in the invention is not particularly limited as long as it is a functional group capable of being positively charged.

As the cationic functional group, a functional group containing a nitrogen atom (a primary nitrogen atom, a secondary nitrogen atom, a tertiary nitrogen atom, or a quaternary nitrogen atom) is preferable. Here, the "functional group containing a nitrogen atom" may also be a functional group constituted by only one nitrogen atom.

The polymer of the invention includes two or more cationic functional groups including at least one of a tertiary nitrogen atom or a quaternary nitrogen atom.

In the invention, a polymer including two or more cationic functional groups including at least one of a tertiary nitrogen atom or a quaternary nitrogen atom means a polymer including two or more cationic functional groups that include at least one of a tertiary nitrogen atom or a quaternary nitrogen atom as a cationic functional group (that is, a polymer including two or more cationic functional groups in which at least one of the two or more cationic functional groups is at least one of a tertiary nitrogen atom or a quaternary nitrogen atom).

The polymer of the invention is preferably a polymer including two or more of at least one of a tertiary nitrogen atom or a quaternary nitrogen atom (particularly preferably a tertiary nitrogen atom) as a cationic functional group.

The polymer of the invention may include primary nitrogen atoms or secondary nitrogen atoms as a cationic functional group.

In a case in which the polymer of the invention contains primary nitrogen atoms, the proportion of the primary nitrogen atoms to all the nitrogen atoms in the polymer is preferably 33% by mole or more. If the polymer of the invention contains primary nitrogen atoms (particularly, if the percentage of primary nitrogen atoms is 33% by mole or more), the wettability between the polymer and the interlayer dielectric layer is more improved and the uniformity of the thickness of the polymer layer is more improved, and thus the sealing property can be more improved.

In addition, in a case in which the polymer contains primary nitrogen atoms, it is preferable that nitrogen atoms other than primary nitrogen atoms, such as secondary nitrogen atoms, coexist with the primary nitrogen atoms. By virtue of this, the thickness of the polymer layer is easily adjusted to an appropriate range, and the sealing property can be further improved.

In addition, the polymer may further include an anionic functional group or a nonionic functional group if necessary.

The nonionic functional group may be a hydrogen bond receptor or a hydrogen bond donor. Examples of the nonionic functional group may include a hydroxyl group, a carbonyl group, and an ether group (—O—).

The anionic functional group is not particularly limited as long as it is a functional group capable of being negatively charged. Examples of the anionic functional group may include a carboxylic acid group, a sulfonic acid group, and a sulfuric acid group.

The polymer is a polymer including two or more cationic functional groups including at least one of a tertiary nitrogen atom or a quaternary nitrogen atom in one molecule. A polymer having a high cation density is preferable from the viewpoint of further improving the sealing property. Specifically, a cationic functional group equivalent is preferably from 27 to 430 and more preferably from 43 to 200.

Moreover, in a case in which the surface of an interlayer dielectric layer is hydrophobic treated by a publicly known method, for example, a method described in WO 04/026765, WO 06/025501, or the like, the cationic functional group equivalent is also preferably from 43 to 200 since the polar group density on the surface decreases.

The cationic functional group equivalent herein means a weight average molecular weight per cationic functional group, and is a value (Mw/n) obtained by dividing the weight average molecular weight (Mw) of a polymer by the number (n) of a cationic functional group contained in the polymer corresponding to one molecule. The density of cationic functional group is low as this cationic functional group equivalent is large, and the density of cationic functional group is high as this cationic functional group equivalent is small.

In a case in which the polymer of the invention includes a structural unit (hereinafter, it is referred to as a "specific structural unit" in some cases) including a cationic functional group, the cationic functional group may be contained as at least part of the main chain, as at least part of a side chain, or as at least part of the main chain and at least part of a side chain in the specific structural unit.

Moreover, in a case in which the specific structural unit includes two or more cationic functional groups, the two or more cationic functional groups may be the same as or different from each other.

In addition, the cationic functional group is contained such that the ratio (hereinafter, it is referred to as a "relative distance between cationic functional groups" in some cases) of the main chain length of the specific structural unit with respect to the average distance between the adsorption points (for example, a silanol residue) of the cationic functional groups present on the interlayer dielectric layer is preferably 1.6 or less and more preferably from 0.08 to 1.0. By virtue of this aspect, the polymer is more efficiently multipoint adsorbed on the interlayer dielectric layer.

The molecular weight of the specific structural unit is preferably from 30 to 500 and more preferably from 40 to 200 from the viewpoint of adsorptivity to the interlayer dielectric layer. Meanwhile, the molecular weight of the specific structural unit means the molecular weight of a monomer constituting the specific structural unit.

The specific structural unit in the invention preferably has a relative distance between the cationic functional groups of 1.6 or less and a molecular weight of from 30 to 500, and more preferably has a relative distance between the cationic functional groups of from 0.08 to 1.0 and a molecular weight of from 40 to 200 from the viewpoint of ads orptivity to an interlayer dielectric layer.

The specific structural unit (a structural unit including a cationic functional group) may be, specifically, the unit structure derived from a monomer containing a cationic functional group exemplified below.

Specific examples of the monomer containing a cationic functional group include an alkyleneimine, allylamine, diallyldimethylammonium salt, vinylpyridine, lysine, methyl vinylpyridine, and p-vinylpyridine.

The alkyleneimine is preferably an alkyleneimine having from 2 to 12 carbon atoms and more preferably an alkyleneimine having from 2 to 8 carbon atoms.

In addition, the alkyleneimine having from 2 to 12 carbon atoms is preferably a substituted or unsubstituted cyclic amine having from 2 to 8 carbon atoms.

Specific examples of the alkyleneimine having from 2 to 12 carbon atoms include ethyleneimine (another name: aziridine), propyleneimine (another name: 2-methyl aziridine), butyleneimine, pentyleneimine, hexyleneimine, heptyleneimine, octyleneimine, trimethyleneimine (another name: azetidine), tetramethyleneimine (another name: pyrrolidine), pentamethyleneimine (another name: piperidine), hexamethyleneimine, and octamethyleneimine. Among them, ethyleneimine is particularly preferable.

The monomer containing a cationic functional group is, among them described above, preferably at least one of an alkyleneimine (preferably an alkyleneimine having from 2 to 8 carbon atoms) or an allylamine, and more preferably an alkyleneimine (preferably an alkyleneimine having from 2 to 4 carbon atoms, particularly preferably ethyleneimine) from the viewpoints of adsorptivity to an interlayer dielectric layer and sealing property.

In addition, the polymer of the invention preferably contains a structural unit that is derived from an alkyleneimine having from 2 to 8 carbon atoms (more preferably having from 2 to 4 carbon atoms) and that contains a tertiary nitrogen atom, as the specific structural unit (the structural unit containing a cationic functional group), from the viewpoints of adsorptivity to an interlayer dielectric layer and sealing property.

The polymer of the invention more preferably contains a structural unit that is derived from an alkyleneimine having from 2 to 8 carbon atoms (more preferably having from 2 to 4 carbon atoms) and that contains a secondary nitrogen atom, in addition to the "structural unit that is derived from an alkyleneimine having from 2 to 8 carbon atoms (more preferably having from 2 to 4 carbon atoms) and that contains a tertiary nitrogen atom", from the viewpoint of easiness of synthesis.

In addition, in a case in which a cationic functional group is introduced into the polymer by reacting at least one of a primary nitrogen atom or a secondary nitrogen atom contained in a polymer with a nitrogen-containing compound in order to increase the branching degree, a cationic functional group ("*" represents a bonding position with a nitrogen atom in the polymer backbone) represented below, or an aminopropyl group, a diaminopropyl group, an aminobutyl group, a diaminobutyl group, and a triaminobutyl group may be exemplified as a cationic functional group introduced into a polymer.

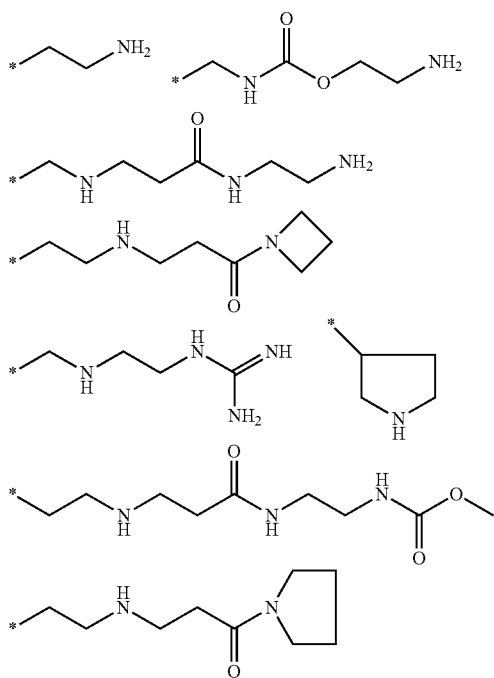

Among the cationic functional groups introduced into a polymer, an aminoethyl group is preferable from the viewpoints of decreasing a cationic functional group equivalent and increasing a cationic functional group density.

In addition, the polymer may further contain at least one kind of a unit structure containing a nonionic functional group or a unit structure containing an anionic functional group.

Specific examples of the unit structure containing a nonionic functional group may include a unit structure derived from a vinyl alcohol, a unit structure derived from an alkylene oxide, and a unit structure derived from vinylpyrrolidone.

Moreover, specific examples of the unit structure containing an anionic functional group may include a unit structure derived from styrenesulfonic acid, a unit structure derived from vinylsulfuric acid, a unit structure derived from acrylic acid, a unit structure derived from methacrylic acid, a unit structure derived from maleic acid, and a unit structure derived from fumaric acid.

In a case in which the polymer contains two or more kinds of specific structural units in the invention, the specific structural units may be different from each other in terms of any of the kind or the number of the contained cationic functional group, the molecular weight, and the like. In addition, the two or more kinds of specific structural units may be contained as a block copolymer or a random copolymer.

In addition, the polymer may further contain at least one kind of structural unit (hereinafter, it is referred to as a "second structural unit" in some cases) other than the specific structural unit described above. In a case in which the polymer contains a second structural unit, the polymer may be a block copolymer containing the specific structural unit and the second structural unit or a random copolymer containing the specific structural unit and the second structural unit.

The second structural unit is not particularly limited as long as it is a structural unit derived from a monomer capable of being polymerized with a monomer constituting the specific structural unit. Examples thereof may include a structural unit derived from an olefin.

In addition, in a case in which the polymer of the invention is a polymer that does not include a particular structural unit but includes a random structure formed by polymerizing a monomer constituting a polymer in a branched manner, the cationic functional group may be contained as at least part of the main chain, as at least part of a side chain, or as at least part of the main chain and at least part of a side chain.

Specific examples of the polymer of the invention may include a polyalkyleneimine (for example, a polyalkyleneimine that is a polymer of an alkyleneimine having from 2 to 12 carbon atoms (preferably having from 2 to 8 carbon atoms and more preferably having from 2 to 4 carbon atoms), particularly preferably polyethyleneimine (PEI)), polyallylamine (PAA), polydiallyl dimethyl ammonium (PDDA), polyvinyl pyridine (PVP), poly-lysine, polymethyl pyridyl vinyl (PMPyV), protonated poly(p-pyridyl vinylene) (R-PH-PyV), and any derivative thereof. Among them, a polyalkyleneimine (for example, a polyalkyleneimine that is a polymer of an alkyleneimine having from 2 to 12 carbon atoms (preferably having from 2 to 8 carbon atoms and more preferably having from 2 to 4 carbon atoms), particularly preferably polyethyleneimine (PEI)) or any derivative thereof, polyallylamine (PAA), and the like are preferable, and a polyalkyleneimine (for example, a polyalkyleneimine that is a polymer of an alkyleneimine having from 2 to 12 carbon atoms (preferably having from 2 to 8 carbon atoms and more preferably having from 2 to 4 carbon atoms), particularly preferably polyethyleneimine (PEI)) or any derivative thereof is more preferable.

Polyethyleneimine (PEI) can be generally produced by polymerizing ethyleneimine by a commonly used method. The polymerization catalyst, polymerization conditions, and the like can also be appropriately selected from those used commonly in the polymerization of ethyleneimine. Specifically, ethyleneimine is subjected to a reaction, for example, at from 0 to 200° C. in the presence of an effective quantity of acid catalyst, for example, hydrochloric acid. Moreover, ethyleneimine may be addition polymerized to a base polyethyleneimine. In addition, polyethyleneimine in the invention may be a homopolymer of ethyleneimine or a copolymer of ethyleneimine and a compound copolymerizable with ethyleneimine, for example, an amine. The production method of such a polyethyleneimine may be referred to in, for example, Japanese Patent Publication (JP-B) No. S43-8828, JP-B No. S49-33120, and the like.

In addition, polyethyleneimine described above may be polyethyleneimine obtained using crude ethyleneimine obtained from monoethanolamine. Specific description thereon may be referred to in, for example, JP-A No. 2001-2123958, and the like.

Meanwhile, a polyalkyleneimine other than polyethyleneimine can be produced by the same method as polyethyleneimine.

Polyethyleneimine produced by the method described above includes a complicated backbone including not only a partial structure in which ethyleneimine is ring opened and bonded in a linear shape, but also a partial structure in which ethyleneimine is ring opened and bonded in a branched shape, a partial structure in which the partial structures in a linear shape are cross-linked with each other, and the like. A polyalkyleneimine other than polyethyleneimine also has a similar structure to polyethyleneimine.

A polymer is more efficiently multipoint adsorbed by using a polymer including a cationic functional group of the structure described above. Moreover, a covering layer is more effectively formed by the interaction between polymers.

The polymer of the invention is also preferably a derivative of polyalkyleneimine (for example, a derivative of polyalkyleneimine that is a polymer of an alkyleneimine having from 2 to 12 carbon atoms (preferably having from 2 to 8 carbon atoms and more preferably having from 2 to 4 carbon atoms), particularly preferably a derivative of polyethyleneimine). The derivative of polyalkyleneimine is not particularly limited as long as it is a compound producible using the polyalkyleneimine described above. Specific examples thereof may include a derivative of polyalkyleneimine in which an alkyl group (preferably an alkyl group having from 1 to 10 carbon atoms) or an aryl group is introduced into a polyalkyleneimine, and a derivative of polyalkyleneimine obtained by introducing a cross-linkable group such as a hydroxyl group into a polyalkyleneimine.

These derivatives of polyalkyleneimine can be produced by a method performed commonly using the polyalkyleneimine described above. Specifically, these derivatives of polyalkyleneimine can be produced based on the method described in, for example, JP-A No. H6-016809, or the like.

In addition, as a derivative of polyalkyleneimine, a highly branched type polyalkyleneimine obtained by increasing the branching degree of a polyalkyleneimine by reacting the polyalkyleneimine with a cationic functional group-containing monomer is also preferable.

Examples of the method of obtaining a highly branched type polyalkyleneimine include a method in which a polyalkyleneimine including plural secondary nitrogen atoms in the backbone is reacted with a cationic functional group-containing monomer and thus at least part of the plural secondary nitrogen atoms are substituted with the cationic functional group-containing monomer, and a method in which a polyalkyleneimine including plural primary nitrogen atoms at terminals is reacted with a cationic functional group-containing monomer and thus at least part of the plural primary nitrogen atoms are substituted with the cationic functional group-containing monomer.

Examples of the cationic functional group introduced in order to increase the branching degree may include an aminoethyl group, an aminopropyl group, a diaminopropyl group, an aminobutyl group, a diaminobutyl group, and a triaminobutyl group, and an aminoethyl group is preferable from the viewpoint of decreasing the cationic functional group equivalent and increasing the cationic functional group density.

As the method of obtaining a highly branched type polyalkyleneimine, a method explained in the section for a "method of producing a polymer" to be described below can be used.

Moreover, polyethyleneimine described above and any derivative thereof may be a commercially available product. For example, polyethyleneimine and any derivative thereof sold by NIPPON SHOKUBAI CO., LTD., BASF Japan Ltd., and the like may also be appropriately selected and used.

The weight average molecular weight of the polymer in the invention is from 2,000 to 1,000,000, preferably from 2,000 to 600,000, preferably from 10,000 to 200,000, further preferably from 20,000 to 200,000, and more preferably from 20,000 to 150,000.

For example, in a case in which the sealing composition for a semiconductor of the invention is applied to the production of a semiconductor device having a wiring interval of 32 nm or less and a pore diameter on the interlayer dielectric layer of about from 2 to 6 nm, if the weight average molecular weight of the polymer is more than 1,000,000, the size of the polymer is greater than the wiring interval, and thus the polymer does not enter into a concave groove in which the wiring material is to be embedded, and as a result, a pore of a side surface of the groove is not sufficiently covered in some cases. In addition, if the weight average molecular weight of the polymer is less than 2,000, the size of the polymer molecule is smaller than the pore diameter on the interlayer dielectric layer, and thus the polymer molecule enters into the pore on the interlayer dielectric layer, and as a result, the dielectric constant of the interlayer dielectric layer increases in some cases. In addition, if the weight average molecular weight of the polymer is less than 2,000, the polymer does not multipoint adsorb in some cases.

Meanwhile, the weight average molecular weight is measured using a GPC device used commonly in the molecular weight measurement of polymer.

In addition, the polymer is also preferably a polymer, of which the critical micelle concentration in a water medium is 1% by weight or more, or by which a micelle structure is not practically formed. Here, the description that a micelle structure is not practically formed indicates that a micelle is not formed under a common condition such as in a water medium of room temperature, that is, the critical micelle concentration cannot be measured. By a polymer having such a feature, a thin polymer layer (for example, 5 nm or less) having a thickness of molecular level is more effectively formed, and increase in the dielectric constant of interlayer dielectric layer can be more effectively suppressed. Furthermore, the adhesion between an interlayer dielectric layer and a wiring material is more effectively improved.

Moreover, the polymer of the invention is preferably polyethyleneimine having a weight average molecular weight of from 2,000 to 1,000,000 and a cationic functional group equivalent of from 27 to 430, more preferably polyethyleneimine having a weight average molecular weight of from 2,000 to 600,000 and a cationic functional group equivalent of from 27 to 430, and particularly preferably polyethyleneimine having a weight average molecular weight of from 10,000 to 150,000 and a cationic functional group equivalent of from 27 to 400. By virtue of this aspect, the diffusion of a metal component or a plasma component into an interlayer dielectric layer is more effectively suppressed and the adhesion between an interlayer dielectric layer and a wiring material is more improved.

The content of the polymer in the sealing composition for a semiconductor of the invention is not particularly limited, and can be, for example, from 0.01% to 5.0% by weight and preferably from 0.02% to 0.3% by weight. In addition, the content of the polymer in the sealing composition can be also adjusted based on the area of a surface, on which a polymer layer is formed using the sealing composition for a semiconductor of the invention, and a pore density.

[Method of Producing Polymer]

As the method of producing a polymer of the invention, for example, a production method including a process of reacting a raw material polymer containing at least one of a primary nitrogen atom or a secondary nitrogen atom with a monomer including a cationic functional group is preferable.

By the reaction described above, at least one of a tertiary nitrogen atom or a quaternary nitrogen atom is generated from at least one of the primary nitrogen atom or the secondary nitrogen atom included in the raw material polymer, and thus the polymer of the invention, which has a branching degree of 48% or more, can be suitably obtained.

The reaction can be performed by mixing the raw material polymer with the monomer including a cationic functional group in a solvent such as water or an alcohol, and refluxing while heating.

The reaction time can be appropriately adjusted, and is, for example, preferably from 1 to 24 hours and more preferably from 2 to 12 hours.

The raw material polymer in the method described above is not particularly limited as long as it contains at least one of a primary nitrogen atom or a secondary nitrogen atom, and a raw material polymer containing a secondary nitrogen atom is preferable.

Examples of the raw material polymer containing a secondary nitrogen atom includes a polyalkyleneimine that is a polymer of an alkyleneimine having from 2 to 12 carbon atoms (preferably having from 2 to 8 carbon atoms), poly(N-alkylamide), or any derivative thereof. Here, specific examples of the alkyleneimine having from 2 to 12 carbon atoms are as described above. In addition, examples of the derivative include a polyalkyleneimine into which an anionic functional group has been introduced.

The weight average molecular weight of the raw material polymer is not particularly limited as long as it is a weight average molecular weight that enables production of the polymer of the invention having a weight average molecular weight of from 2,000 to 1,000,000 by a reaction with a monomer including a cationic functional group.

For example, the weight average molecular weight of the raw material polymer is preferably from 1,000 to 500,000, more preferably from 2,000 to 200,000, and particularly preferably from 5,000 to 150,000.

In addition, examples of the monomer including a cationic functional group used in the production method described above include a nitrogen-containing compound.

In addition, the cationic functional group in the monomer including a cationic functional group used in the production method described above is preferably bonded to a protective group that is stable under the reaction condition.

By virtue of this, the reaction between the monomers including a cationic functional group can be suppressed, and thus a polymer having a higher branching degree can be produced.

As the protective group, a protective group used commonly can be used.

Examples of the protective group include a t-butoxycarbonyl group (Boc group), a benzyloxycarbonyl group, a methoxycarbonyl group, a fluorenylcarbonyl group, a formyl group, an acetyl group, a benzoyl group, a phthaloyl group, an allyl group, and a benzyl group.

As the monomer including a cationic functional group bonded to a protective group, a nitrogen-containing compound including a nitrogen atom bonded to a protective group is more preferable.

Specific examples of the nitrogen-containing compound including a nitrogen atom bonded to a protective group include a compound represented by any one of the following Formulas (m-1) to (m-3).

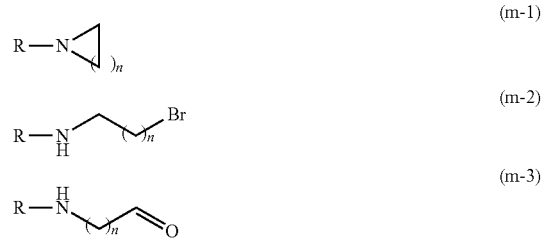

In Formulas (m-1) to (m-3), R represents a protective group, and n represents an integer from 1 to 4.

The protective group represented by R may be any functional group that is generally used as the protective group for a nitrogen atom, and, for example, a t-butoxycarbonyl group (Boc group), a benzyloxycarbonyl group, a methoxycarbonyl group, a fluorenylcarbonyl group, a formyl group, an acetyl group, a benzoyl group, a phthaloyl group, an allyl group, and a benzyl group are preferable.

The nitrogen-containing compound (monomer) including a nitrogen atom bonded to a protective group is further preferably a compound represented by Formula (m-1), and particularly preferably a compound (protected aziridine) represented by Formula (m-1) in which n is 1.

In addition, as the method of producing a polymer of the invention, a production method including a process of reacting a raw material polymer (for example, a polyalkyleneimine that is a polymer of an alkyleneimine having from 2 to 12 carbon atoms) containing a secondary nitrogen atom with a compound represented by Formula (m-1) is particularly preferable.

In addition, the method of producing a polymer may include another process such as a process of deprotecting a cationic functional group including a protective group introduced into a polymer, if necessary.

[Other Components]

A content of sodium and a content of potassium in the sealing composition for a semiconductor of the invention are each 10 ppb by weight or less on an element basis. If the content of sodium and the content of potassium are each more than 10 ppb by weight on an element basis, a trouble in electrical properties of a semiconductor device such as failure of transistor occurs in some cases.

The sealing composition for a semiconductor of the invention can contain a solvent in addition to the polymer if necessary. The solvent in the invention is not particularly limited as long as it is a solvent in which the polymer dissolves uniformly and hardly forms a micelle. Examples of the solvent may include water (preferably ultrapure water) and a water soluble organic solvent (for example, an alcohol, or the like). In the invention, water or a mixture of water and a water soluble organic solvent is preferably used as a solvent from the viewpoint of micelle forming property.

In addition, the boiling point of the solvent is not particularly limited, but is preferably 210° C. or lower and further preferably 160° C. or lower. If the boiling point of solvent is in the above described range, the solvent can be removed at a temperature low enough not to significantly damage the dielectric properties of the interlayer dielectric layer and not to allow the sealing composition to be peeled off from the interlayer dielectric layer, for example in a case in which a cleaning process or a drying process is provided after a process in which the sealing composition for a semiconductor of the invention is brought into contact with an interlayer dielectric layer.

Moreover, the sealing composition for a semiconductor of the invention may further contain a cation such as a cesium ion if necessary in a range that does not impair the effect of the invention. If a cation such as a cesium ion is contained in the composition, the polymer in the sealing composition for a semiconductor is prone to be more uniformly spread on the interlayer dielectric layer.

Furthermore, it is preferable that the sealing composition for a semiconductor of the invention does not contain a compound that brings about corrosion or dissolution of the interlayer dielectric layer. Specifically, for example, if a fluorine compound or the like is contained in the composition of the invention, the interlayer dielectric layer is dissolved, and thus the dielectric properties of the interlayer dielectric layer are damaged and relative dielectric constant thereof increases in some cases particularly in a case in which the main material of the interlayer dielectric layer is an inorganic compound such as silica.

The sealing composition for a semiconductor of the invention preferably contains only a compound that has a boiling point of 210° C. or lower and preferably 160° C. or lower, or only a compound that does not exhibit degradability even heated up to 250° C., as a component other than the polymer.

Meanwhile, the "compound that does not exhibit degradability even heated up to 250° C." is a compound of which the weight change after being held at 250° C. under nitrogen for 1 hour is less than 50% with respect to the weight measured at 25° C.

The sealing composition for a semiconductor of the invention preferably has an average particle diameter measured by a dynamic light scattering method of 150 nm or less.

If the average particle diameter is 150 nm or less, adhesion with the wiring material is more improved, and thus diffusion of a metal component or a plasma component into an interlayer dielectric layer is further suppressed.

The average particle diameter in the invention is measured by a dynamic light scattering method using ELSZ-2 manufactured by OTSUKA ELECTRONICS CO., LTD. and obtained as a cumulant average particle diameter. The measurement is performed under a condition of, for example, a solution concentration of from 0.1% to 1.0%, a temperature of from 23° C. to 26° C., a cumulative number of 70 times, a repeat count of 3 times, and the like. A stable measurement can be performed by adding an electrolyte such as NaCl if necessary.

Meanwhile, the case in which the average particle diameter is more than 150 nm in the invention is specifically a case in which a micelle (a micelle having an average particle diameter of more than 150 nm) is formed in the composition, a case in which a polishing grain such as a metal oxide, or the like used at the time of polishing (chemical mechanical polishing) copper to be a wire is contained in the composition, or the like.

If a micelle having a large particle diameter is formed in the sealing composition for a semiconductor, a polymer constituting the sealing composition for a semiconductor cannot sufficiently enter into a concave groove in which a wiring material is to be embedded, and thus a pore on a side surface of the groove cannot be sufficiently covered in some cases, for example, in a case in which the sealing composition for a semiconductor of the invention is applied to the production of a semiconductor device having a line width of 32 nm or less.

The average particle diameter is preferably 100 nm or less, more preferably 50 nm or less, further more preferably 30 nm or less, and particularly preferably 10 nm or less from the viewpoint that the adhesion with the wiring material is more improved and the diffusion of a metal component or a plasma component into an interlayer dielectric layer is further suppressed.

The pH of the sealing composition for a semiconductor of the invention is not particularly limited, and the pH is preferably equal to or higher than an isoelectric point of an interlayer dielectric layer from the viewpoint of the adsorptivity of a polymer to the interlayer dielectric layer. In addition, the pH of the sealing composition for a semiconductor of the invention is preferably in a pH range in which the cationic functional group is in a cationic state. If the sealing composition for a semiconductor has the pH described above, the polymer is more efficiently adsorbed on an interlayer dielectric layer by the electrostatic interaction between the interlayer dielectric layer and the polymer.

The isoelectric point of an interlayer dielectric layer is the isoelectric point exhibited by a compound constituting the interlayer dielectric layer, and for example, in a case in which a compound constituting an interlayer dielectric layer is porous silica, the isoelectric point is near pH 2 (25° C.).

In addition, the pH range in which the cationic functional group is in a cationic state is such that the pH of the sealing composition for a semiconductor is equal to or less than the $pK_b$ of a polymer containing a cationic functional group. For example, in a case in which a polymer containing a cationic functional group is polyallylamine, the $pK_b$ is from 8 to 9, and in a case of polyethyleneimine, the $pK_b$ is from 7 to 12.

In other words, the pH of the sealing composition for a semiconductor in the invention can be appropriately selected depending on the kind of the compound constituting an interlayer dielectric layer and the kind of the polymer, and the pH is, for example, preferably from 2 to 12 and more preferably from 7 to 11.

Meanwhile, the pH (25° C.) is measured using a pH measuring device used commonly.

<Method of Producing Semiconductor Device>

The method of producing a semiconductor device of the invention includes a sealing composition application process of applying the sealing composition for a semiconductor of the invention to an interlayer dielectric layer formed on a substrate, and further includes another process if necessary.

The interlayer dielectric layer in the invention is preferably constituted by a material having a low dielectric constant. In addition, the interlayer dielectric layer in the invention is preferably a porous interlayer dielectric layer (that is, an interlayer dielectric layer having a porous structure).

The pore radius of the porous interlayer dielectric layer is not particularly limited, but is preferably from 0.5 nm to 4.0 nm and more preferably from 1.0 nm to 3.0 nm from the viewpoint that the sealing property effect in the production method is more effectively exhibited.

In addition, the interlayer dielectric layer preferably contains porous silica and has a silanol residue derived from porous silica on the surface. In this case, a thin layer of a polymer is formed such that pores on the interlayer dielectric layer are covered with the polymer by the interaction of the silanol residue and a cationic functional group contained in the polymer.

As the porous silica, a porous silica that is commonly used in an interlayer dielectric layer of semiconductor device can be used without particular limitation. Examples thereof may include an oxide having a uniform mesopore in which self-organization of an organic compound and an inorganic compound is used and which is hydrothermally synthesized in a sealed heat resistant container using a surfactant and silica gel described in WO 91/11390, or porous silica produced from a surfactant and a condensate of an alkoxysilane described in Nature, Vol. 379, p. 703, 1996 or Supramolecular Science, Vol. 5, p. 247, 1998.

In addition, as the porous silica, porous silica (for example, porous silica formed using a composition containing a specific siloxane compound) described in WO 2009/123104 (Paragraphs from [0009] to [0187]) or WO 2010/137711 (Paragraphs from [0043] to [0088]) is preferably used.

The substrate provided with an interlayer dielectric layer in the production method is not particularly limited, and examples thereof may include a semiconductor substrate such as silicon wafer, a glass substrate, a quartz substrate, a stainless substrate, and a plastic substrate. The shape of the substrate is also not particularly limited, and may be any shape such as a platy shape or a patelliform shape.

The method of producing a semiconductor device of the invention includes a sealing composition application process of applying the sealing composition for a semiconductor of the invention to an interlayer dielectric layer formed on a substrate.

The method of applying the sealing composition for a semiconductor of the invention to the interlayer dielectric layer is not particularly limited, and a method used commonly can be used. For example, a dipping method (for example, see the specification of U.S. Pat. No. 5,208,111), a spraying method (for example, see Schlenoff et al., Langmuir, 16 (26), p. 9968, 2000 or Izquierdo et al., Langmuir, 21 (16), p. 7558, 2005), a spin coating method (for example, see Lee et al., Langmuir, 19 (18), p. 7592, 2003 or J. Polymer Science, part B, polymer physics, 42, p. 3654, 2004), and the like can be used.

The method of applying the sealing composition for a semiconductor by the spin coating method is not particularly limited, and for example, a method can be used in which a sealing composition for a semiconductor is dropped on an interlayer dielectric layer while rotating a substrate on which the interlayer dielectric layer is formed by a spin coater, subsequently a rinsing treatment is performed by dropping a rinsing liquid such as water, and then drying is performed by increasing the revolution number of the substrate. At this time, drying may be performed after dropping of the sealing composition for a semiconductor, and dropping of water are repeated plural times. Alternatively, a sealing composition for a semiconductor may be dropped and then dried by increasing the number of revolutions, and after drying, the substrate may be temporarily transferred to a heat treatment device such as a hot plate and subjected to a heat treatment, and after heat treatment, the substrate may be reinstalled to the spin coater again, and then a rinsing treatment and drying may be performed (these operations described above may be repeated plural times).

In the method of applying the sealing composition for a semiconductor by the spin coating method, conditions such as the revolution number of the substrate, the amount of the sealing composition for a semiconductor dropped and the dropping time thereof, the revolution number of substrate at the time of drying, and the amount of the rinsing liquid dropped and the dropping time thereof are not particularly limited, and can be appropriately adjusted in consideration of the thickness of a polymer layer (sealing layer) to be formed.

In the method of producing a semiconductor device of the invention, a polymer layer containing the polymer can be formed on an interlayer dielectric layer as a thin layer using the sealing composition for a semiconductor containing the polymer. The thickness of the polymer layer is not particularly limited, and is, for example, from 0.3 nm to 30 nm, preferably from 0.3 nm to 10 nm, more preferably from 0.3 nm to 5 nm, and particularly preferably from 0.5 nm to 2 nm.

Meanwhile, examples of the polymer layer stated herein include not only a form of a layer of polymer only but also a form of a layer (so-called infiltration layer) having a structure in which a polymer is infiltrated into the pores of a porous interlayer dielectric layer, in a case that the interlayer dielectric layer is a porous interlayer dielectric layer.

In the method of producing a semiconductor device of the invention, it is preferable that the sealing composition for a semiconductor contains a polymer having a cationic functional group equivalent of from 27 to 430, and the pH of the sealing composition for a semiconductor is equal to or higher than the isoelectric point of the interlayer dielectric layer, and the pH is in the range in which the cationic functional group is in a cationic state, and the pH is more preferably from 2 to 12, further preferably from 7 to 11. The polymer is more efficiently adsorbed to the interlayer dielectric layer by bringing the sealing composition for a semiconductor into contact with the interlayer dielectric layer.

The isoelectric point of the interlayer dielectric layer and the pH range in which the cationic functional group is in a cationic state are as described above.

Further, the concentration of the polymer contained in the sealing composition for a semiconductor used in the sealing composition application process of the invention is preferably less than the critical micelle concentration of the polymer. By virtue of this, the polymer can be applied to the interlayer dielectric layer as a thin layer (for example, 5 nm or less and more preferably 2 nm or less), and increase in dielectric constant can be suppressed.

It is preferable that the method of producing a semiconductor device of the invention further includes a process of forming a concave groove having a width of from 10 nm to 32 nm in the interlayer dielectric layer, and the sealing composition application process is a process of bringing the sealing composition for a semiconductor into contact with the interlayer dielectric layer at at least a side surface of the concave groove.

By virtue of this aspect, the interlayer dielectric layer (pores present on an interlayer dielectric layer in a case in which this interlayer dielectric layer is a porous interlayer dielectric layer) constituting the side surface of the concave groove formed in the interlayer dielectric layer can be effectively covered. The diffusion of a metal component constituting a wiring material into the interlayer dielectric layer can be suppressed in a case in which the wiring material is embedded in the concave groove.

Meanwhile, the side surface of a concave groove means a surface formed so as to intersect approximately orthogonally with respect to the surface parallel to a substrate.

The process of forming a concave groove having a width of from 10 nm to 32 nm in the interlayer dielectric layer can be performed according to the commonly used production process conditions of a semiconductor device. For example, a hard mask and a photoresist are formed on an interlayer dielectric layer, and etching is performed according to the pattern of the photoresist, whereby a groove having a desired pattern can be formed.

In addition, as the method of bringing the sealing composition for a semiconductor into contact with the interlayer dielectric layer on a side surface of the concave groove, the dipping method, the spraying method, and the spin coating method described above can be used.

In the invention, a cleaning process or a drying process may be further provided if necessary after bringing the sealing composition for a semiconductor into contact with the interlayer dielectric layer.

In the method of producing a semiconductor device of the invention, a process that is commonly performed, such as a wiring forming process, may be further included if necessary after the sealing composition application process.

The wiring forming process can be performed according to a publicly known process condition. For example, a copper wiring is formed by a metal CVD method, a sputtering method, or an electrolytic plating method, and the film is smoothed by CMP. Subsequently, a cap film is formed on the surface of the film. A hard mask is further formed if necessary. A multilayer can be formed by repeating the processes described above, whereby the semiconductor device of the invention can be produced.

Moreover, in the method of producing a semiconductor device of the invention, a barrier film (copper barrier layer) forming process can be further provided after the sealing composition application process but before the wiring forming process. The diffusion of metal component into the interlayer dielectric layer can be more effectively suppressed by forming a barrier film.

The barrier film forming process can be performed according to a process condition used commonly. For example, a barrier film of a titanium compound such as titanium nitride, a tantalum compound such as tantalum nitride, a ruthenium compound, or a manganese compound can be formed by a vapor growth method (CVD) after the sealing composition application process. In the invention, a barrier film consisting of ruthenium compound is preferably formed.

<Semiconductor Device>

The semiconductor device of the invention includes a structure in which an interlayer dielectric layer (preferably a porous interlayer dielectric layer), a polymer layer containing a polymer including two or more cationic functional groups including at least one of a tertiary nitrogen atom or a quaternary nitrogen atom and having a weight average molecular weight of from 2,000 to 1,000,000, and a layer including copper are disposed in this order, and further includes other layers if necessary. Since a polymer layer containing a specific polymer is disposed between the interlayer dielectric layer and the wiring material, the occurrence of leakage current or the like is suppressed even in a fine circuit constitution of 32 nm or less, and thus favorable characteristics can be exhibited.

In the semiconductor device of the invention, the thickness of the polymer layer is preferably from 0.3 nm to 5 nm.

In addition, in the semiconductor device of the invention, it is preferable that a copper barrier layer (preferably, a layer of ruthenium compound) is further disposed between the polymer layer and the wiring material containing copper.

Meanwhile, the semiconductor device of the invention can be produced by the method of producing a semiconductor device.

EXAMPLES

Hereinafter, the invention will be described in more detail with reference to Examples, but the invention is not limited to these Examples.

Synthesis Example 1

<Synthesis of Hyperbranched Polyethyleneimine 1>
(Synthesis of Modified Polyethyleneimine 1)

Modified polyethyleneimine 1 was synthesized according to the following

Reaction scheme 1 using polyethyleneimine as a starting material.

Meanwhile, the polymer structures in the following Reaction scheme 1 and Reaction scheme 2 are structures illustrated schematically. The configuration of the tertiary nitrogen atom and the secondary nitrogen atom or the proportion of the secondary nitrogen atom to be substituted with a Boc-aminoethyl group to be described below changes in various ways by the synthesis condition.

Reaction scheme 1

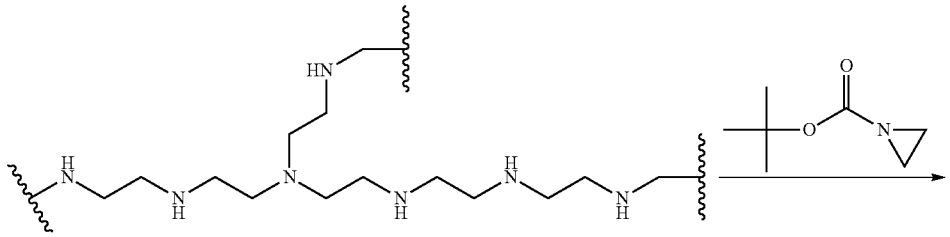

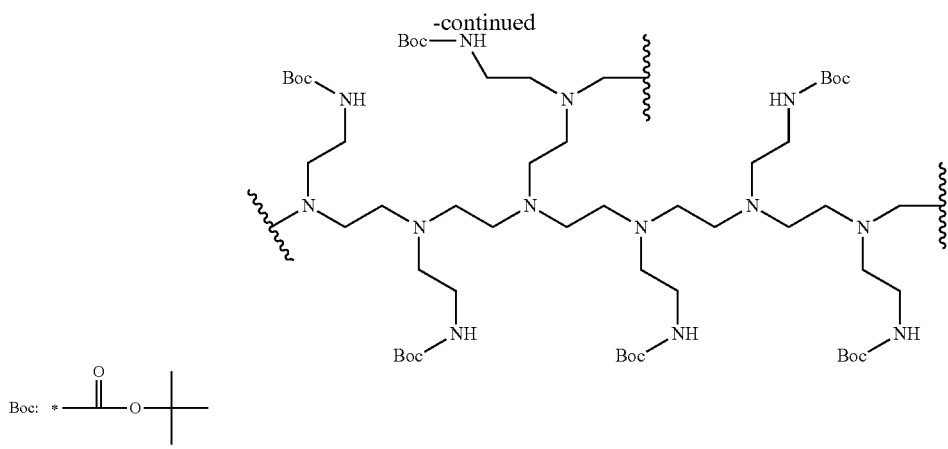

In Reaction scheme 1 above, * represents a bonding position.

In this Synthesis Example 1, the detailed operation of Reaction scheme 1 above was as follows.

In 70 mL of isopropanol, 10.5 g of polyethyleneimine (50% aqueous solution) manufactured by MP Biomedicals, LLC. was dissolved, 17.5 g (122 mmol) of N-t-butoxycarbonyl (in Examples, t-butoxycarbonyl group is also referred to as "Boc") aziridine was added thereto, and the resultant was refluxed for 10 hours while heating, thereby obtaining modified polyethyleneimine 1 having a structure in which a Boc-aminoethyl group was introduced into polyethyleneimine. It was confirmed that N-Boc aziridine of the raw material was not present by thin-layer chromatography (TLC). The solvent was concentrated under reduced pressure, and then the structure of the resultant was confirmed by $^1$H-NMR. The introduction rate of the Boc-aminoethyl group with respect to polyethyleneimine was calculated to be 95% from $^1$H-NMR data.

$^1$H-NMR (CD$_3$OD): δ 3.3-3.0 (br. s, 2), 2.8-2.5 (Br. s, 6.2), 1.45 (s, 9)

(Synthesis of Hyperbranched Polyethyleneimine 1)

Hyperbranched polyethyleneimine 1 was synthesized according to the following Reaction scheme 2 using the modified polyethyleneimine 1 as the starting material.

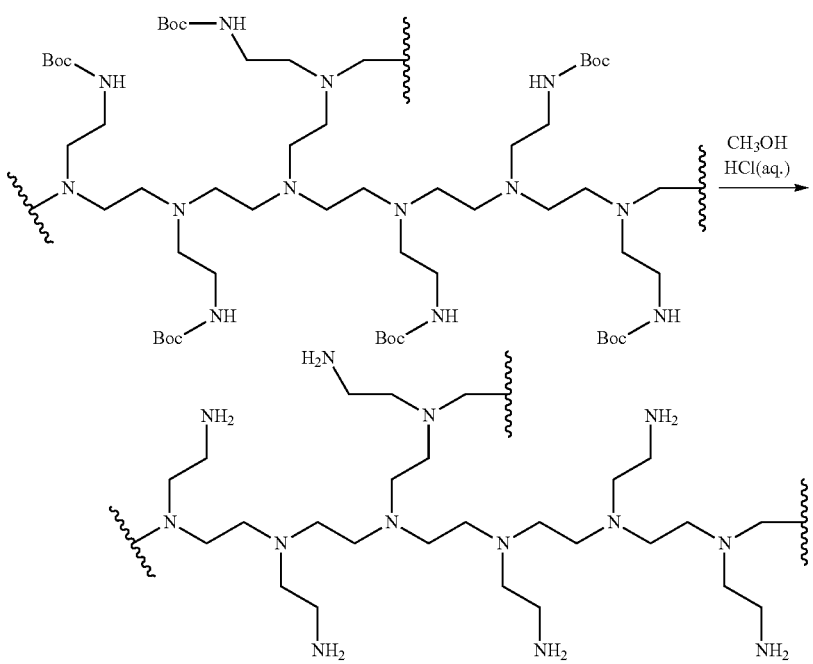

In this Synthesis Example 1, the detailed operation of Reaction scheme 2 above was as follows.

The modified polyethyleneimine 1 was dissolved in 40 mL of methanol, and 20 mL of 12N hydrochloric acid was gradually added to this solution while stirring the solution thus obtained. The solution thus obtained was stirred at 50° C. for 4 hours while heating. Reaction product in the form of gum was generated in the reaction solution together with the generation of gas. The reaction solution was cooled after generation of gas was completed. After cooling, the solvent separated from this reaction product in the form of gum was removed, and then the remaining reaction product was washed with 10 mL of methanol two times. The reaction product after washing was dissolved in water, and the chlorine ion was removed by an anion exchange polymer, thereby obtaining 8 g of hyperbranched polyethyleneimine 1.

$^1$H-NMR (D$_2$O): δ 2.8-2.4 (br. m)

$^{13}$C-NMR (D$_2$O): δ (integration ratio) 57.2 (1.0), 54.1 (0.38), 52.2 (2.26), 51.6 (0.27), 48.5 (0.07), 46.7 (0.37), 40.8 (0.19), 38.8 (1.06)

With regard to the hyperbranched polyethyleneimine 1, the weight average molecular weight, the molecular weight distribution, the cationic functional group (a primary nitrogen atom, a secondary nitrogen atom, a tertiary nitrogen atom, and a quaternary nitrogen atom) equivalent, the amount (% by mole) of primary nitrogen atom, the amount (% by mole) of secondary nitrogen atom, the amount (% by mole) of tertiary nitrogen atom, the amount (% by mole) of quaternary nitrogen atom, the branching degree (%), and the viscosity η (dl/g) were measured, respectively. The results of the measurements are listed in Table 1 to be described below.

Here, the cationic functional group equivalent is a value of the molecular weight with respect to one cationic functional group, and can be calculated from the structure of polymer.

In addition, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were calculated on the basis of the integrated value obtained as follows. A polymer sample (in this Synthesis Example 1, hyperbranched polyethyleneimine 1) was dissolved in heavy water, and $^{13}$C-NMR measurement was performed by a single pulse reverse gated decoupling method at 80° C. using AVANCE 500 type nuclear magnetic resonance apparatus manufactured by Bruker Japan Co., Ltd. with regard to the solution thus obtained, and analysis on which order of amine (nitrogen atom) each of the carbons was bonded to was performed from the result of $^{13}$C-NMR measurement. Description on assignment is stated in European Polymer Journal, 1973, Vol. 9, pp. 559, and the like.

The weight average molecular weight and the molecular weight distribution were measured using Shodex GPC-101 as an analytical instrument and Asahipak GF-7M HQ as a column, and calculated using polyethylene glycol as the reference standard. However, since the standard curve of GPC changes as the branching degree increases as known by the Mark-Houwink-Sakurada equation, it should be noted that the weight average molecular weight and the molecular weight distribution in Table 1 are the numerical values based on polyethylene glycol.

Here, the amount (% by mole) of primary nitrogen atom, the amount (% by mole) of secondary nitrogen atom, the amount (% by mole) of tertiary nitrogen atom, and the amount (% by mole) of quaternary nitrogen atom are the amounts represented by the following Equations A to D, respectively.

Amount (% by mole) of primary nitrogen atom=(mole number of primary nitrogen atom/(mole number of primary nitrogen atom+mole number of secondary nitrogen atom+mole number of tertiary nitrogen atom+mole number of quaternary nitrogen atom))×100   Equation A Amount (% by mole) of secondary nitrogen atom= (mole number of secondary nitrogen atom/(mole number of primary nitrogen atom+mole number of secondary nitrogen atom+mole number of tertiary nitrogen atom+mole number of quaternary nitrogen atom))×100   Equation B Amount (% by mole) of tertiary nitrogen atom=(mole number of tertiary nitrogen atom/(mole number of primary nitrogen atom+mole number of secondary nitrogen atom+mole number of tertiary nitrogen atom+mole number of quaternary nitrogen atom))×100   Equation C Amount (% by mole) of quaternary nitrogen atom= (mole number of quaternary nitrogen atom/(mole number of primary nitrogen atom+mole number of secondary nitrogen atom+mole number of tertiary nitrogen atom+mole number of quaternary nitrogen atom))×100   Equation D In addition, the branching degree was obtained by the following Equation E.

Branching degree (%)=((amount (% by mole) of tertiary nitrogen atom+amount (% by mole) of quaternary nitrogen atom)/(amount (% by mole) of secondary nitrogen atom+amount (% by mole) of tertiary nitrogen atom+amount (% by mole) of quaternary nitrogen atom)×100   Equation E In addition, viscosity η (dl/g) was obtained by measuring the sample solution drain time (seconds) and blank drain time (seconds) using Ubbelohde viscometer with regard to an aqueous solution containing 0.5% by weight of hyperbranched polyethyleneimine 1 and then calculating by the following Equation F.

Viscosity η (dl/g)=(ln(sample solution drain time (seconds)/blank drain time (seconds)))/concentration of solution (g/dl)   Equation F Synthesis Example 2

<Synthesis of Hyperbranched Polyethyleneimine 2>
(Synthesis of Modified Polyethyleneimine 2)

Modified polyethyleneimine 2 was synthesized by the same reaction scheme as Reaction scheme 1 above. However, in this Synthesis Example 2, the detailed operation was as follows.

In 64 mL of isopropanol, 12.8 g of polyethyleneimine (50% aqueous solution) manufactured by MP Biomedicals, LLC. was dissolved, 4.26 g (30 mmol) of N-Boc aziridine is added thereto, and the resultant was refluxed for 3 hours while heating, thereby obtaining reaction liquid containing modified polyethyleneimine 2 having a structure in which a Boc-aminoethyl group was introduced into polyethyleneimine. It was confirmed that N-Boc aziridine of the raw material was not present by TLC. A small amount of the reaction liquid was taken as a sample and then NMR measurement of the sample was performed, thereby confirming the structure thereof. The introduction rate of the Boc-aminoethyl group with respect to polyethyleneimine was calculated to be 20% from $^1$H-NMR data.

$^1$H-NMR (CD$_3$OD): δ 3.3-3.0 (br. s, 2), 2.8-2.5 (Br. s, 23), 1.45 (s, 9)

(Synthesis of Hyperbranched Polyethyleneimine 2)

Hyperbranched polyethyleneimine 2 was synthesized by the same reaction scheme as Reaction scheme 2 above. However, in this Synthesis Example 2, the detailed operation was as follows.

To this reaction liquid containing the modified polyethyleneimine 2, 14.9 mL of 12N hydrochloric acid was gradually added while stirring the reaction liquid. The solution thus obtained was stirred at 50° C. for 3 hours while heating. Reaction product in the form of gum was generated in the reaction solution together with the generation of gas. The reaction solution was cooled after generation of gas was completed. After cooling, the solvent separated from this reaction product in the form of gum was removed, and then the remaining reaction product was washed with 10 mL of methanol three times. The reaction product after washing was dissolved in water, and the chlorine ion was removed by an anion exchange polymer, thereby obtaining 10.5 g of hyperbranched polyethyleneimine 2.

$^1$H-NMR (D$_2$O): δ 2.8-2.4 (br. m)

$^{13}$C-NMR (D$_2$O): δ (integration ratio) 57.1 (1.0), 54.1 (1.61), 52.2 (2.75), 51.5 (0.82), 48.5 (1.07), 46.6 (1.67), 40.7 (0.79), 38.8 (1.04)

With regard to the hyperbranched polyethyleneimine 2, the weight average molecular weight, the molecular weight distribution, the cationic functional group equivalent, the amount (% by mole) of primary nitrogen atom, the amount (% by mole) of secondary nitrogen atom, the amount (% by mole) of tertiary nitrogen atom, the amount (% by mole) of quaternary nitrogen atom, the branching degree (%), and the viscosity η (dl/g) were measured, respectively in the same manner as in the hyperbranched polyethyleneimine 1. The results of the measurements are listed in Table 1 to be described below.

Synthesis Example 3

<Synthesis of Hyperbranched Polyethyleneimine 3>

In 30 mL of methanol, 10.0 g of polyethyleneimine P-1000 (30% aqueous solution) manufactured by NIPPON SHOKUBAI CO., LTD. was dissolved, and the solution thus obtained was cooled to 10° C. or lower. To the solution after cooling, 6.0 g (70 mmol) of methyl acrylate was added dropwise, and then was left to stand at room temperature for 48 hours. A small amount of the solution after leaving to stand was taken as a sample, and then it was confirmed that methyl acrylate was not present by $^1$H-NMR measurement. To the solution after leaving to stand, 83.7 g (1395 mmol) of ethylenediamine was added and then refluxed for 9 hours while heating. The reaction solvent and excessive ethylenediamine were distilled off under reduced pressure from the solution after refluxing, and the residue was dissolved in 25 mL of methanol. A polymer was precipitated by adding ethyl acetate to the solution thus obtained, and then the solvent was removed, and the residue was washed with ethyl acetate. Water was added to the residue after washing, and then the resultant was concentrated under reduced pressure, thereby obtaining 8.55 g of hyperbranched polyethyleneimine 3.

$^1$H-NMR (D$_2$O): δ 3.3-3.1 (br. s, 1), 2.9-2.2 (Br. m, 6)

With regard to the hyperbranched polyethyleneimine 3, the weight average molecular weight, the molecular weight distribution, the cationic functional group equivalent, the amount (% by mole) of primary nitrogen atom, the amount (% by mole) of secondary nitrogen atom, the amount (% by mole) of tertiary nitrogen atom, the amount (% by mole) of quaternary nitrogen atom, the branching degree (%), and the viscosity η (dl/g) were measured, respectively in the same manner as in the hyperbranched polyethyleneimine 1. The results of the measurements are listed in Table 1 to be described below.

Synthesis Example 4

<Synthesis of Hyperbranched Polyethyleneimine 4>

Hyperbranched polyethyleneimine 4 having a branching degree of 90% was synthesized by repeating the reactions represented in Reaction schemes 1 and 2 above three times. Hereinafter, the details will be described.

(Synthesis of Modified Polyethyleneimine 4A: Reaction scheme 1)

Modified polyethyleneimine 4A was synthesized according to Reaction scheme 1 above. The detailed operation is as follows.

In 53 mL of isopropanol, 8.0 g of polyethyleneimine (50% aqueous solution) manufactured by MP Biomedicals, LLC. was dissolved, 13.3 g (93 mmol) of N-Boc aziridine is added thereto, and the resultant was refluxed for 8 hours while heating, thereby obtaining modified polyethyleneimine 4A having a structure in which a Boc-aminoethyl group was introduced into polyethyleneimine. It was confirmed that N-Boc aziridine of the raw material was not present by thin-layer chromatography (TLC). A small amount of the resultant thus obtained was taken as a sample and then $^1$H-NMR measurement of the sample was performed, thereby confirming the structure thereof. The introduction rate of the Boc-aminoethyl group with respect to polyethyleneimine was calculated to be 95% from $^1$H-NMR data.

$^1$H-NMR (CD$_3$OD): δ 3.3-3.0 (br. s, 2), 2.8-2.5 (Br. s, 6.2), 1.45 (s, 9)

(Synthesis of Branched Polyethyleneimine 4A: Reaction scheme 2)

Branched polyethyleneimine 4A was synthesized according to Reaction scheme 2 above using the modified polyethyleneimine 4A as the starting material. The detailed operation is as follows.

To an isopropanol solution of the modified polyethyleneimine 4A, 18 mL of 12N hydrochloric acid was gradually added. The solution thus obtained was stirred at 50° C. for 3 hours while heating, and attention was paid to the generation of gas. Reaction product in the form of gum was generated in the reaction solution together with the generation of gas. The reaction solution was cooled after generation of gas was completed. After cooling, the solvent separated from this reaction product in the form of gum was removed, and then the remaining reaction product was washed with 15 mL of methanol four times. The remaining reaction product was dissolved in water, and the chlorine ion was removed by an anion exchange polymer, thereby obtaining 26 g (purity: about 30%) of branched polyethyleneimine 4A.

$^1$H-NMR (D$_2$O): δ 2.8-2.4 (br. m)

(Synthesis of Modified Polyethyleneimine 4B: Reaction Scheme 1)

Modified polyethyleneimine 4B was synthesized according to Reaction scheme 1 above using the branched polyethyleneimine 4A as the starting material. The detailed operation is as follows.

In 31 mL of isopropanol, the branched polyethyleneimine 4A (9.1 g, purity: about 30%) was dissolved, 7.8 g (54.4 mmol) of N-Boc aziridine is added thereto, and the resultant was refluxed for 8 hours while heating, thereby obtaining modified polyethyleneimine 4B having a structure in which a Boc-aminoethyl group was introduced into polyethyleneimine. It was confirmed that N-Boc aziridine of the raw material was not present by thin-layer chromatography (TLC). A small amount of the resultant thus obtained was taken as a sample and then $^1$H-NMR measurement of the sample was performed, thereby confirming the structure thereof. The introduction rate of the Boc-aminoethyl group with respect to polyethyleneimine was calculated to be 90% from $^1$H-NMR data.

$^1$H-NMR (CD$_3$OD): δ 3.3-3.0 (br. s, 2), 2.8-2.5 (Br. s, 6.2), 1.45 (s, 9)

(Synthesis of Branched Polyethyleneimine 4B: Reaction scheme 2)

Branched polyethyleneimine 4B was synthesized according to Reaction scheme 2 above using the modified polyethyleneimine 4B as the starting material. The detailed operation is as follows.

To an isopropanol solution of the modified polyethyleneimine 4B, 13 mL of 12N hydrochloric acid was gradually added. The solution thus obtained was stirred at 50° C. for 4 hours while heating, and attention was paid to the generation of gas. Reaction product in the form of gum was generated in the reaction solution together with the generation of gas. The reaction solution was cooled after generation of gas was completed. After cooling, the solvent separated from this reaction product in the form of gum was removed, and then the remaining reaction product was washed with 10 mL of methanol three times. The remaining reaction product was dissolved in water, and the chlorine ion was removed by an anion exchange polymer, thereby obtaining 11.29 g (purity: about 40%) of branched polyethyleneimine 4B.

$^1$H-NMR (D$_2$O): δ 2.8-2.4 (br. m)

(Synthesis of Modified Polyethyleneimine 4C: Reaction Scheme 1)

Modified polyethyleneimine 4C was synthesized according to Reaction scheme 1 above using the branched polyethyleneimine 4B as the starting material. The detailed operation is as follows.

In 22.5 mL of isopropanol, the branched polyethyleneimine 4B (4.7 g, purity: about 40%) was dissolved, 5.6 g (39.4 mmol) of N-Boc aziridine is added thereto, and the resultant was refluxed for 8 hours while heating, thereby obtaining modified polyethyleneimine 4C having a structure in which a Boc-aminoethyl group was introduced into polyethyleneimine. It was confirmed that N-Boc aziridine of the raw material was not present by thin-layer chromatography (TLC). A small amount of the resultant thus obtained was taken as a sample and then $^1$H-NMR measurement of the sample was performed, thereby confirming the structure thereof. The introduction rate of the Boc-aminoethyl group with respect to polyethyleneimine was calculated to be 90% from $^1$H-NMR data.

$^1$H-NMR (CD$_3$OD): δ 3.3-3.0 (br. s, 2), 2.8-2.5 (Br. s, 6.2), 1.45 (s, 9)

(Synthesis of Hyperbranched Polyethyleneimine 4: Reaction scheme 2)

Hyperbranched polyethyleneimine 4 was synthesized according to Reaction scheme 2 above using the modified polyethyleneimine 4C as the starting material. The detailed operation is as follows.

To an isopropanol solution of the modified polyethyleneimine 4C, 9 mL of 12N hydrochloric acid was gradually added. The solution thus obtained was stirred at 50° C. for 4 hours while heating, and attention was paid to the generation of gas. Reaction product in the form of gum was generated in the reaction solution together with the generation of gas. The reaction solution was cooled after generation of gas was completed. After cooling, the solvent separated from this reaction product in the form of gum was removed, and then the remaining reaction product was washed with 10 mL of methanol three times. The remaining reaction product was dissolved in water, and the chlorine ion was removed by an anion exchange polymer, thereby obtaining 8.4 g (purity: about 40%) of hyperbranched polyethyleneimine 4.

$^1$H-NMR (D$_2$O): δ 2.8-2.4 (br. m)

With regard to the hyperbranched polyethyleneimine 4, cationic functional group equivalent, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree were measured, respectively, in the same manner as in the hyperbranched polyethyleneimine 1.

As a result, the cationic functional group equivalent was 43, the amount of primary nitrogen atom was 47% by mole, the amount of secondary nitrogen atom was 5% by mole, the amount of tertiary nitrogen atom was 48% by mole, the amount of quaternary nitrogen atom was 0% by mole, and the branching degree was 90%.

The weight average molecular weight of the hyperbranched polyethyleneimine 4 was not able to be measured at the moment, but it is thought that the weight average molecular weight thereof is in the range of from 2,000 to 1,000,000 in consideration of the synthesis conditions described above.

Example 1

<Preparation of Sealing Composition for a Semiconductor>

A sealing composition for a semiconductor (hereinafter, it is also referred to as the "sealing composition 1") was obtained by dissolving the hyperbranched polyethyleneimine 1 (250 mg) in 100 mL of water.

With regard to the sealing composition 1 thus obtained, the content of sodium, the content of potassium, and the volume average particle diameter was measured, respectively.

The results of the measurements are listed in Table 1 below.

Here, the content of sodium and the content of potassium were measured using an inductively coupled plasma mass spectrometer (ICP-MS), respectively. The lower limit of measurement in this measurement is 1 ppb by weight for both of the content of sodium and the content of potassium.

In addition, in order to confirm the micelle forming property, the volume average particle diameter was measured by a dynamic light scattering method using ELSZ-2 manufactured by OTSUKA ELECTRONICS CO., LTD. The volume average particle diameter was less than the detection limit (<10 nm).

Meanwhile, the measuring condition was a cumulative number of 70 times, a repeat count of 1 time, and a histogram analysis and a cumulant analysis were used as the analysis condition.

[Formation of Interlayer Dielectric Film]

A composition for porous silica formation was prepared using the following respective components, and then an interlayer dielectric film was formed using the composition for porous silica formation thus obtained.

Hereinafter, the details will be described.

(Components of Composition for Porous Silica Formation)

—Alkoxysilane Compound—

Purified bis(triethoxysilyl)ethane (manufactured by Gelest, Inc., (C$_2$H$_5$O)$_3$SiCH$_2$CH$_2$Si(OC$_2$H$_5$)$_3$) by distillation, and Dimethyldiethoxysilane (manufactured by YAMANAKA SEMICONDUCTOR CORPORATION (currently YAMANAKA HUTECH CORPORATION), an electronics industry grade, ((CH$_3$)$_2$Si(OC$_2$H$_5$)$_2$)).

—Surfactant—

A compound obtained by dissolving polyoxyethylene (20) stearyl ether (manufactured by Sigma-Aldrich Co. LLC., Trade name: Brij78, C$_{18}$H$_{37}$ (CH$_2$CH$_2$O)$_{20}$H) in ethanol for electronics industry, and performing a demetallization treatment to 10 ppb or less using an ion exchange polymer.

—Disilyl Compound—

Purified hexamethyldisiloxane (manufactured by Sigma-Aldrich Co. LLC., $((CH_3)_3Si)_2O$) by distillation.

—Water—

Pure water which is subjected to a demetallization treatment and has a resistance value of 18 MΩ or higher.

—Organic Solvent—

Ethanol (manufactured by Wako Pure Chemical Industries, Ltd., an electronics industry grade, $C_2H_5OH$), 1-Propyl alcohol (manufactured by KANTO CHEMICAL CO., INC., an electronics industry grade, $CH_3CH_2CH_2OH$), and 2-Butyl alcohol (manufactured by KANTO CHEMICAL CO., INC. an electronics industry grade, $CH_3(C_2H_5)CHOH$).

(Preparation of Precursor Solution)

At room temperature, 77.4 g of bis(triethoxysilyl)ethane and 70.9 g of ethanol were mixed and stirred, and then 80 mL of 1 mol/L nitric acid was added thereto and stirred at 50° C. for 1 hour. Next, a solution obtained by dissolving 41.7 g of polyoxyethylene (20) stearyl ether in 280 g of ethanol was mixed dropwise thereto. After mixing, the resultant was stirred at 30° C. for 4 hours. The solution thus obtained was concentrated to be 123 g at 25° C. under reduced pressure of 30 hPa. After concentration, a solution obtained by mixing 1-propyl alcohol and 2-butyl alcohol at a volume ratio of 2:1 was added thereto, thereby obtaining 1280 g of a precursor solution.

(Preparation of Composition for Porous Silica Formation)

To 218 g of the precursor solution, 1.2 g of dimethyldiethoxysilane and 0.6 g of hexamethyldisiloxane were added and stirred at 25° C. for 1 hour, thereby obtaining a composition for porous silica formation. The amount of dimethyldiethoxysilane added and the amount of hexamethyldisiloxane added at this time were 10% by mole and 5% by mole with respect to bis(triethoxysilyl)ethane, respectively.

(Formation of Interlayer Dielectric Layer)

On the surface of a silicon wafer, 1.0 mL of the composition for porous silica formation was dropped and rotated at 2,000 rpm for 60 seconds, thereby coating the surface of the silicon wafer. The silicon wafer was heat treated under an atmosphere of nitrogen at 150° C. for 1 minute and subsequently at 350° C. for 10 minutes. Thereafter, the silicon wafer was heated to 350° C. in a chamber equipped with a 172 nm excimer lamp and then irradiated with an ultraviolet ray at an output of 14 mW/cm$^2$ and a pressure of 1 Pa for 10 minutes, thereby obtaining an interlayer dielectric layer (porous silica film).

The pore radius of the interlayer dielectric layer thus obtained was 2.6 nm.

In addition, the relative dielectric constant k of the interlayer dielectric layer thus obtained was 2.1, and the elastic modulus E thereof was 6.2 GPa.

The pore radius of the interlayer dielectric layer was calculated from the isothermal line of toluene desorption. Here, the isothermal line of toluene desorption was measured by the same technique as in the sealing property evaluation to be described below using an optical porosimeter (PS-1200) manufactured by SEMILAB JAPAN K. K. The pore radius was calculated using the Kelvin equation according to the technique described in M. R. Baklanov, K. P. Mogilnikov, V. G. Polovinkin, and F. N. Dultsey, Journal of Vacuum Science and Technology B (2000) 18, pp. 1385 to 1391.

In addition, the relative dielectric constant was measured by a conventional method using a mercury probe instrument (SSM5130) at 25° C. under an atmosphere of 30% relative humidity, and at a frequency of 100 kHz.

In addition, the elastic modulus was measured by a conventional method using a nanoindenter (Triboscope manufactured by Hysitron Corporation) at an indentation depth of equal to or less than ⅒ of the film thickness.

<Application of Sealing Composition for a Semiconductor>

The sealing composition 1 (2.0 mL) was dropped on the interlayer dielectric layer (hereinafter, it is referred to as a "low-k film" in some cases) at a constant speed for 30 seconds while rotating the silicon wafer having the low-k film formed thereon using a spin coater at 600 rpm, and then drying was performed by rotating at 2,000 rpm for 10 seconds. Thereafter, the silicon wafer was transferred onto a hot plate, and then subjected to a heat treatment in the air at 125° C. for 1 minute. Subsequently, the silicon wafer was reinstalled to the spin coater, and then 3.0 mL of ultrapure water was dropped on the surface of the side, on which the sealing composition 1 had been dropped, of the silicon wafer at a constant speed for 30 seconds while rotating at 600 rpm, and then drying was performed by rotating at 2,000 rpm for 60 seconds. This film forming operation of the sealing layer was repeated three times.

By the method described above, a layer (sealing layer) of the polymer contained in the sealing composition 1 was formed on the interlayer dielectric layer, thereby obtaining a laminated body (hereinafter, it is also referred to as a "sample (Si/low-k/PEI)") having a structure in which a silicon wafer, an interlayer dielectric layer, and a sealing layer were laminated in order.

Meanwhile, as water, ultrapure water (Milli-Q water manufactured by Millipore Corporation, resistance: 18 MΩ·cm or less (25° C.)) was used.

<Evaluation of Sealing Property>

Evaluation of sealing property was performed using the sample (Si/low-k/PEI).

The evaluation of sealing property was performed by measuring the toluene adsorption characteristics on the sealing layer (PEI) surface of the sample (Si/low-k/PEI). In this measurement of the toluene adsorption characteristics, the sealing property that prevents the wiring material (copper or the like) from invading into the low-k film is great as the amount of toluene adsorbed is small.

The adsorption of toluene was measured using an optical porosimeter (PS-1200) manufactured by SEMILAB JAPAN K. K.

As the measuring method, a technique described in M. R. Baklanov, K. P. Mogilnikov, V. G. Polovinkin, and F. N. Dultsey, Journal of Vacuum Science and Technology B (2000) 18, pp. 1385 to 1391 was adopted.

Specifically, the sample chamber having the sample (Si/low-k/PEI) therein was evacuated to 5 mTorr in a temperature range of from 23° C. to 26° C., and the toluene gas was sufficiently gradually introduced into the sample chamber. At each of the pressures, the refractive index of the low-k film was measured in situ by an ellipsometer instrument. This operation was performed until the pressure in the sample chamber reached to the saturated vapor pressure of toluene. In the same manner, the refractive index at each of the pressures was measured along with evacuating little by little the atmosphere in the sample chamber. By this operation, change in refractive index caused by the adsorption and desorption of toluene on the low-k film was obtained. Moreover, the isothermal line of the toluene gas adsorption and desorption was calculated from the relative pressure characteristic of the refractive index using the Lorentz-Lorenz equation.

The isothermal line of the toluene gas adsorption and desorption is illustrated in FIG. 1.

The horizontal axis in FIG. 1 represents the relative pressure of toluene ($P/P_0$: here, P represents the partial pressure of toluene at room temperature and $P_0$ represents the saturated vapor pressure of toluene at room temperature), and the vertical axis represents the volume fraction (the ratio of the volume of toluene adsorbed at room temperature with respect to the volume of the entire low-k film) of the amount of toluene adsorbed. The volume fraction of the amount of toluene adsorbed was obtained based on the refractive index of the low-k film using the Lorentz-Lorenz equation.

The sealing property is excellent as the relative pressure of toluene is large in a case in which the volume fraction of the amount of toluene adsorbed is the same.

<Measurement of Thickness of Sealing Layer>

The following measurement was performed in order to investigate the thickness (film thickness) of the sealing layer (PEI) in the sample (Si/low-k/PEI).

In other words, the same operation as in <Application of Sealing composition for a semiconductor> was performed except that the silicon wafer having an interlayer dielectric layer formed thereon was changed to a silicon wafer not having an interlayer dielectric layer formed thereon in <Application of Sealing composition for a semiconductor>. In this manner, a sample (hereinafter, it is also simply referred to as a "sample for measurement") for measurement of the thickness of the sealing layer, which had a structure having a sealing layer formed directly on the silicon wafer, was obtained.

The thickness (unit: nm) of the sealing layer in the sample for measurement thus obtained was measured by a conventional method using an ellipsometer of an optical porosimeter (PS-1200) manufactured by SEMILAB JAPAN K. K.

The results of the measurements of the sealing layer thickness (film thickness) are listed in Table 1.

Example 2

A sealing composition for a semiconductor (hereinafter, it is referred to as the "sealing composition 2") was prepared in the same manner as in Example 1 except that the hyperbranched polyethyleneimine 1 was changed to the hyperbranched polyethyleneimine 2 of the same mass. The same measurements and evaluations as in Example 1 were performed.

The result of evaluation on the sealing property (isothermal line of toluene gas adsorption and desorption) is illustrated in FIG. 1.

In addition, the results of the respective measurements with regard to the sealing composition 2 are listed in Table 1.

Example 3

The application (preparation of sample (Si/low-k/PEI)) of sealing composition for a semiconductor was performed in the same manner as in Example 1 except that the pore radius of the low-k film was changed from 2.6 nm to 2.1 nm by changing the weight of polyoxyethylene (20) stearyl ether to 31.3 g, and the number of the film forming operation of the sealing layer was changed from three times to one time. The same measurements and evaluations as in Example 1 were performed.

Figure 2:
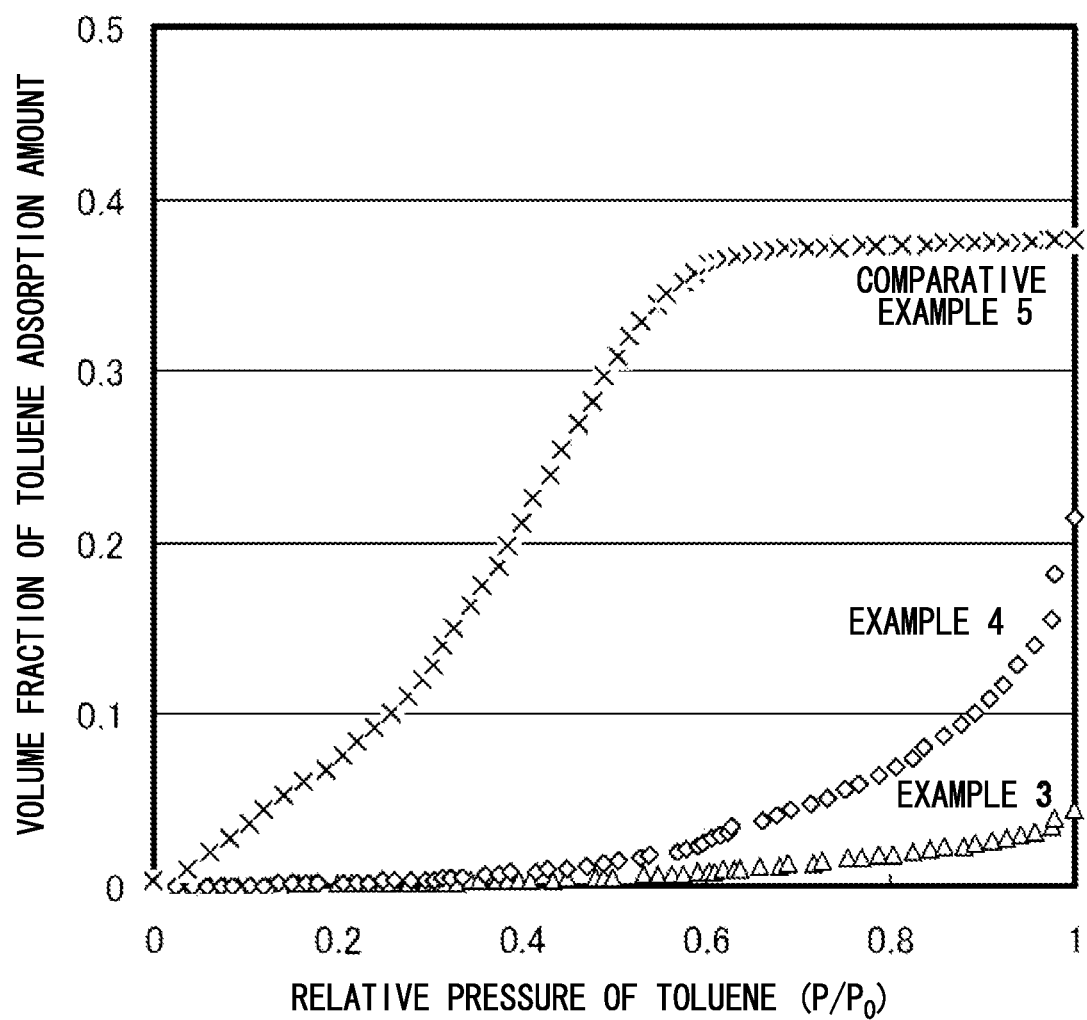
FIG. 2 is isothermal lines of toluene gas adsorption and desorption in Examples 3 and 4 and Comparative Example 5.

The result of evaluation on the sealing property (isothermal line of toluene gas adsorption and desorption) is illustrated in FIG. 2.

Example 4

A sealing composition for a semiconductor (hereinafter, it is referred to as the "sealing composition 3") was prepared in the same manner as in Example 3 except that the hyperbranched polyethyleneimine 1 was changed to the hyperbranched polyethyleneimine 3 of the same mass. The same measurements and evaluations as in Example 3 were performed.

The result of evaluation on the sealing property (isothermal line of toluene gas adsorption and desorption) is illustrated in FIG. 2.

In addition, the results of the respective measurements with regard to the sealing composition 3 are listed in Table 1.

Comparative Example 1

A sealing composition for a semiconductor (hereinafter, it is referred to as the "comparative sealing composition 1") was prepared in the same manner as in Example 1 except that the hyperbranched polyethyleneimine 1 was changed to the polyethyleneimine 1 (prepared by purifying polyethyleneimine manufactured by MP Biomedicals, LLC. using a hollow fiber filter of 10 k and removing the low molecular weight components therefrom) of the same mass. The same measurements and evaluations as in Example 1 were performed.

The result of evaluation on the sealing property (isothermal line of toluene gas adsorption and desorption) is illustrated in FIG. 1.

In addition, the results of the respective measurements with regard to the comparative sealing composition 1 are listed in Table 1.

Comparative Example 2

A sealing composition for a semiconductor (hereinafter, it is referred to as the "comparative sealing composition 2") was prepared in the same manner as in Example 1 except that the hyperbranched polyethyleneimine 1 was changed to the polyethyleneimine 2 (polyethyleneimine Lupasol WF manufactured by BASF Japan Ltd.) of the same mass. The same measurements and evaluations as in Example 1 were performed.

The result of evaluation on the sealing property (isothermal line of toluene gas adsorption and desorption) is illustrated in FIG. 1.

In addition, the results of the respective measurements with regard to the comparative sealing composition 2 are listed in Table 1.

Comparative Example 3

A sealing composition for a semiconductor (hereinafter, it is referred to as the "comparative sealing composition 3") was prepared in the same manner as in Example 1 except that the hyperbranched polyethyleneimine 1 was changed to the polyethyleneimine 3 (polyethyleneimine manufactured by MP Biomedicals, LLC.) of the same mass. The same measurements and evaluations as in Example 1 were performed.

The result of evaluation on the sealing property (isothermal line of toluene gas adsorption and desorption) is illustrated in FIG. 1.

In addition, the results of the respective measurements with regard to the comparative sealing composition 3 are listed in Table 1.

Comparative Example 4

The same measurements and evaluations as in Example 1 were performed except that the hyperbranched polyethyleneimine 1 was not used (that is, the sealing composition 1 was changed to water of the same mass).

The result of evaluation on the sealing property (isothermal line of toluene gas adsorption and desorption) is illustrated in FIG. 1.

Comparative Example 5

A sealing composition for a semiconductor (hereinafter, it is referred to as the "comparative sealing composition 3") was prepared in the same manner as in Example 3 except that the hyperbranched polyethyleneimine 1 was changed to the polyethyleneimine 3 (polyethyleneimine manufactured by MP Biomedicals, LLC.) of the same mass. The same measurements and evaluations as in Example 3 were performed.

The result of evaluation on the sealing property (isothermal line of toluene gas adsorption and desorption) is illustrated in FIG. 2.

TABLE 1

| | | | Example 1 | Example 2 | Comparative Example 1 | Comparative Example 2 | Comparative Example 3 |
|---|---|---|---|---|---|---|---|
| Sealing composition for a semiconductor | | Kind | Sealing composition 1 | Sealing composition 2 | Comparative sealing composition 1 | Comparative sealing composition 2 | Comparative sealing composition 3 |
| | Polymer | Kind | Hyperbranched polyethyleneimine 1 | Hyperbranched polyethyleneimine 2 | Polyethyleneimine 1 | Polyethyleneimine 2 | Polyethyleneimine 3 |
| | | Weight average molecular weight | 40575 | 159435 | 183288 | 17568 | 130774 |
| | | Molecular weight distribution | 7.08 | 17.47 | 4.83 | 2.75 | 16.55 |
| | | Cationic functional group equivalent | 43 | 43 | 43 | 43 | 43 |
| | | Branching degree (%) | 80 | 50 | 45 | 42 | 45 |
| | | Amount of primary nitrogen atom (% by mole) | 45 | 34 | 32 | 31 | 32 |
| | | Amount of secondary nitrogen atom (% by mole) | 11 | 33 | 38 | 40 | 38 |
| | | Amount of tertiary nitrogen atom (% by mole) | 44 | 33 | 30 | 29 | 30 |
| | | Amount of quaternary nitrogen atom (% by mole) | 0 | 0 | 0 | 0 | 0 |
| | | Viscosity η (dl/g) | 0.18 | 0.33 | 0.71 | 0.15 | 0.47 |
| | | Content of Na (ppb by weight) | <1 | <1 | <1 | <1 | <1 |
| | | Content of K (ppb by weight) | <1 | <1 | <1 | <1 | <1 |
| | | Volume average particle diameter (nm) | <10 | <10 | <10 | <10 | <10 |
| Number of film forming operation of sealing layer | | | 3 times | 3 times | 3 times | 3 times | 3 times |
| Pore radius of low-k film (nm) | | | 2.6 | 2.6 | 2.6 | 2.6 | 2.6 |
| Film thickness of sealing layer (nm) | | | 12.2 | 12.2 | N.D. | 3.9 | 9.4 |

| | | | Comparative Example 4 | Example 3 | Example 4 | Comparative Example 5 |
|---|---|---|---|---|---|---|
| Sealing composition for a semiconductor | | Kind | (Water) | Sealing composition 1 | Sealing composition 3 | Comparative sealing composition 3 |
| | Polymer | Kind | — | Hyperbranched polyethyleneimine 1 | Hyperbranched polyethyleneimine 3 | Polyethyleneimine 3 |
| | | Weight average molecular weight | — | 40575 | 107097 | 130774 |
| | | Molecular weight distribution | — | 7.08 | 13.6 | 16.55 |
| | | Cationic functional group equivalent | — | 43 | 79 | 43 |
| | | Branching degree (%) | — | 80 | 77 | 45 |
| | | Amount of primary nitrogen atom (% by mole) | — | 45 | 44 | 32 |
| | | Amount of secondary nitrogen atom (% by mole) | — | 11 | 13 | 38 |
| | | Amount of tertiary nitrogen atom (% by mole) | — | 44 | 44 | 30 |
| | | Amount of quaternary nitrogen atom (% by mole) | — | 0 | 0 | 0 |
| | | Viscosity η (dl/g) | — | 0.18 | 0.26 | 0.47 |
| | | Content of Na (ppb by weight) | — | <1 | <1 | <1 |
| | | Content of K (ppb by weight) | — | <1 | <1 | <1 |
| | | Volume average particle diameter (nm) | — | <10 | <10 | <10 |
| Number of film forming operation of sealing layer | | | — | 1 time | 1 time | 1 time |
| Pore radius of low-k film (nm) | | | 2.6 | 2.1 | 2.1 | 2.1 |
| Film thickness of sealing layer (nm) | | | — | 3.7 | 5.3 | 4.2 |

FIG. 1 is the isothermal lines (a graph illustrating the relation between the relative pressure of toluene and the volume fraction of the amount of toluene adsorbed) of toluene gas adsorption and desorption in Examples 1 and 2 and Comparative Examples 1 to 4, in which the pore radius of the low-k film was 2.6 nm and the number of the film forming operation of sealing layer was 3 times.

The sealing property is excellent as the relative pressure of toluene is large in a case in which the volume fraction of the amount of toluene adsorbed is the same (for example, see the dashed line in FIG. 1).

As illustrated in FIG. 1, the sealing property with respect to the low-k film was excellent in Examples 1 and 2, in which the branching degree of the polymer was 48% or more. Particularly in Example 1, the volume fraction of the amount of toluene adsorbed was significantly small over the whole range (0 to 1) of the relative pressure of toluene, and significantly excellent sealing property was exhibited.

In addition, in Examples 1 and 2 and Comparative Examples 1 to 3, the thickness of the sealing layer, which was measured according to <Measurement of Thickness of Sealing Layer> described above, was as listed in Table 1.

Meanwhile, in Table 1, the term "N. D." (no data) indicates that there is no result of measurement since the measurement is not performed.

From the result of evaluation on sealing property illustrated in FIG. 1 and the measurement result of the thickness of sealing layer listed in Table 1, it is confirmed that the sealing layers in Examples 1 and 2 exhibit excellent sealing property with respect to the low-k film in spite of the fact that the thickness thereof is significantly thin to be about 12 nm.

FIG. 2 is the isothermal lines (a graph illustrating the relation between the relative pressure of toluene and the volume fraction of the amount of toluene adsorbed) of toluene gas adsorption and desorption in Examples 3 and 4 and Comparative Example 5, in which the pore radius of the low-k film was 2.1 nm and the number of the film forming operation of sealing layer was 1 time.

As illustrated in FIG. 2, the sealing property with respect to the low-k film was excellent in Examples 3 and 4, in which the branching degree of the polymer was 48% or more.

In addition, in Examples 3 and 4 and Comparative Example 5, the thickness of the sealing layer, which was measured according to <Measurement of Thickness of Sealing Layer> described above, was as listed in Table 1.

From the result of evaluation on sealing property illustrated in FIG. 2 and the measurement result of the thickness of sealing layer listed in Table 1, it is confirmed that the sealing layers in Examples 3 and 4 exhibit excellent sealing property with respect to the low-k film in spite of the fact that the thickness thereof is significantly thin to be about from 4 to 5 nm.

Example 5

Evaluation on the sealing property of the sealing layer formed through a heat treatment (heat treatment B described below) at 350° C. was performed according to the following procedure.

A silicon wafer with low-k film (pore radius: 1.6 nm) was prepared by changing the pore radius of the low-k film from 2.1 nm to 1.6 nm by changing the weight of polyoxyethylene (20) stearyl ether to 20.9 g in Example 3.

The silicon wafer with low-k film (pore radius: 1.6 nm) thus prepared was installed to a spin coater, and the sealing composition 1 (1.0 mL) was dropped on the low-k film and then held for 23 seconds. Subsequently, the silicon wafer was rotated at 4,000 rpm for 1 second, further rotated at 600 rpm for 30 seconds, and then further rotated at 2,000 rpm for 10 seconds, thereby performing drying. Thereafter, the silicon wafer was transferred onto a hot plate, and then subjected to a heat treatment (hereinafter, it is also referred to as the "heat treatment A") in the air at 125° C. for 1 minute. Subsequently, the silicon wafer was reinstalled to the spin coater, and then 3.0 mL of ultrapure water was dropped on the surface of the side, on which the sealing composition 1 had been dropped, of the silicon wafer at a constant speed for 30 seconds while rotating at 600 rpm, and then drying was performed by rotating at 2,000 rpm for 60 seconds. Subsequently, a heat treatment (hereinafter, it is also referred to as the "heat treatment B") was performed under an atmosphere of nitrogen at 350° C. for 2 minutes, thereby obtaining a sample (Si/low-k/PEI) of Example 5.

The same measurements and evaluations as in Example 3 were performed (see Table 2 below) using the sample (Si/low-k/PEI) of Example 5 thus obtained.

Figure 3:
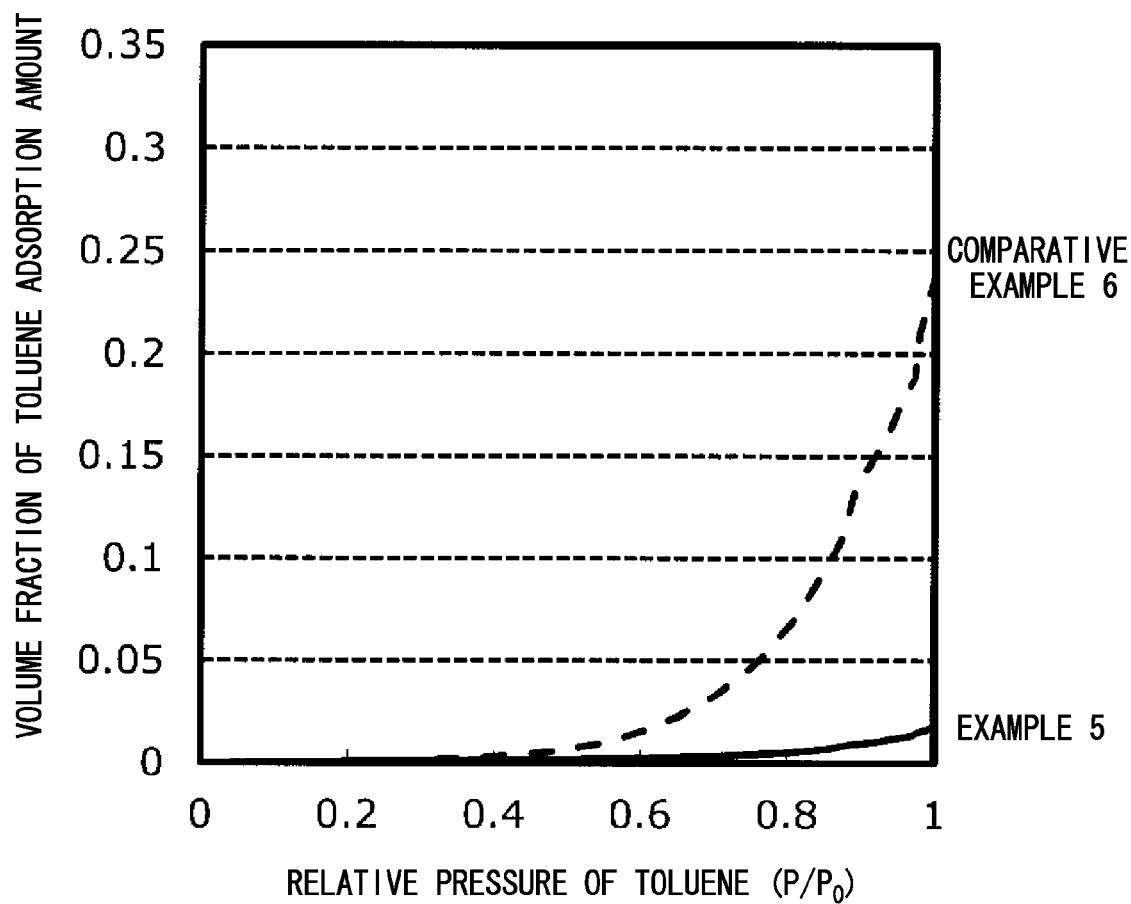
FIG. 3 is isothermal lines of toluene gas adsorption and desorption in Example 5 and Comparative Example 6.

The result of evaluation on the sealing property (isothermal line of toluene gas adsorption and desorption) is illustrated in FIG. 3.

Comparative Example 6

The same measurements and evaluations as in Example 5 were performed except that the hyperbranched polyethyleneimine 1 was changed to the polyethyleneimine 3 (polyethyleneimine manufactured by MP Biomedicals, LLC.) of the same mass (see Table 2 below).

The result of evaluation on the sealing property (isothermal line of toluene gas adsorption and desorption) is illustrated in FIG. 3.

TABLE 2

|  |  |  | Example 5 | Comparative Example 6 |
|---|---|---|---|---|
| Sealing composition for a semiconductor | Kind | | Sealing composition 1 | Comparative sealing composition 3 |
| | Polymer | Kind | Hyperbranched polyethyleneimine 1 | Polyethyleneimine 3 |
| | | Weight average molecular weight | 40575 | 130774 |
| | | Molecular weight distribution | 7.08 | 16.55 |
| | | Cationic functional group equivalent | 43 | 43 |
| | | Branching degree (%) | 80 | 45 |
| | | Amount of primary nitrogen atom (% by mole) | 45 | 32 |
| | | Amount of secondary nitrogen atom (% by mole) | 11 | 38 |
| | | Amount of tertiary nitrogen atom (% by mole) | 44 | 30 |
| | | Amount of quaternary nitrogen atom (% by mole) | 0 | 0 |
| | | Viscosity $\eta$ (dl/g) | 0.18 | 0.47 |

TABLE 2-continued

|  | Example 5 | Comparative Example 6 |
|---|---|---|
| Content of Na (ppb by weight) | <1 | <1 |
| Content of K (ppb by weight) | <1 | <1 |
| Volume average particle diameter (nm) | <10 | <10 |
| Heat treatment in film forming operation of sealing layer | Heat treatment A (125° C., 1 min, Air) ↓ Heat treatment B (350° C., 2 min, $N_2$) | Heat treatment A (125° C., 1 min, Air) ↓ Heat treatment B (350° C., 2 min, $N_2$) |
| Pore radius of low-k film (nm) | 1.6 | 1.6 |
| Film thickness of sealing layer (nm) | 6.0 | 6.9 |

FIG. 3 is the isothermal lines (a graph illustrating the relation between the relative pressure of toluene and the volume fraction of the amount of toluene adsorbed) of toluene gas adsorption and desorption in Example 5 and Comparative Example 6.

As illustrated in FIG. 3, the sealing property with respect to the low-k film is superior in Example 5 compared to Comparative Example 6.

This is presumed to be because the thermal decomposition of the polymer caused by the heat treatment B at 350° C. is suppressed in Example 5 since the branching degree of the polymer contained in the sealing layer is higher (that is, the polymer is bulky) in Example 5 compared to Comparative Example 6.

In addition, from the result of evaluation on sealing property illustrated in FIG. 3 and the measurement result of the thickness of sealing layer listed in Table 2, it is confirmed that the sealing layer in Example 5 exhibits excellent sealing property with respect to the low-k film in spite of the fact that the thickness thereof is significantly thin to be 6.0 nm.

Example 6

A sealing composition for a semiconductor (hereinafter, it is referred to as the "sealing composition 4") was prepared in the same manner as in Comparative Example 5 except that the polyethyleneimine 3 (polyethyleneimine manufactured by MP Biomedicals, LLC.) in Comparative Example 5 was changed to the hyperbranched polyethyleneimine 4 (polyethyleneimine having a branching degree of 90%) of the same mass. The same measurements as in Comparative Example 5 were performed. In this sealing composition 4, the content of Na was less than 1 ppb by weight, the content of K was less than 1 ppb by weight, and the volume average particle diameter was less than 10 nm.

Next, a silicon wafer with low-k film (pore radius: 2.1 nm) was prepared in the same manner as in Comparative Example 5. The silicon wafer with low-k film (pore radius: 2.1 nm) thus prepared was installed to a spin coater, and the sealing composition 4 (1.0 mL) was dropped on the low-k film and then held for 23 seconds. Subsequently, the silicon wafer was rotated at 4,000 rpm for 1 second, further rotated at 600 rpm for 30 seconds, and then further rotated at 2,000 rpm for 10 seconds, thereby performing drying. Thereafter, the silicon wafer was transferred onto a hot plate, and then subjected to a heat treatment in the air at 125° C. for 1 minute. Subsequently, the silicon wafer was reinstalled to the spin coater, and then 3.0 mL of ultrapure water was dropped on the surface of the side, on which the sealing composition 4 had been dropped, of the silicon wafer at a constant speed for 30 seconds while rotating at 600 rpm, and then drying was performed by rotating at 2,000 rpm for 60 seconds. A sample (Si/low-k/PEI) of Example 6 was obtained in the manner as described above.

The same measurements and evaluations as in Comparative Example 5 were performed (FIG. 4) using the sample (Si/low-k/PEI) of Example 6 thus obtained.

In addition, the thickness of the sealing layer was measured in the same manner as in Comparative Example 5. As a result, the thickness of the sealing layer was 4.0 nm.

Figure 4:
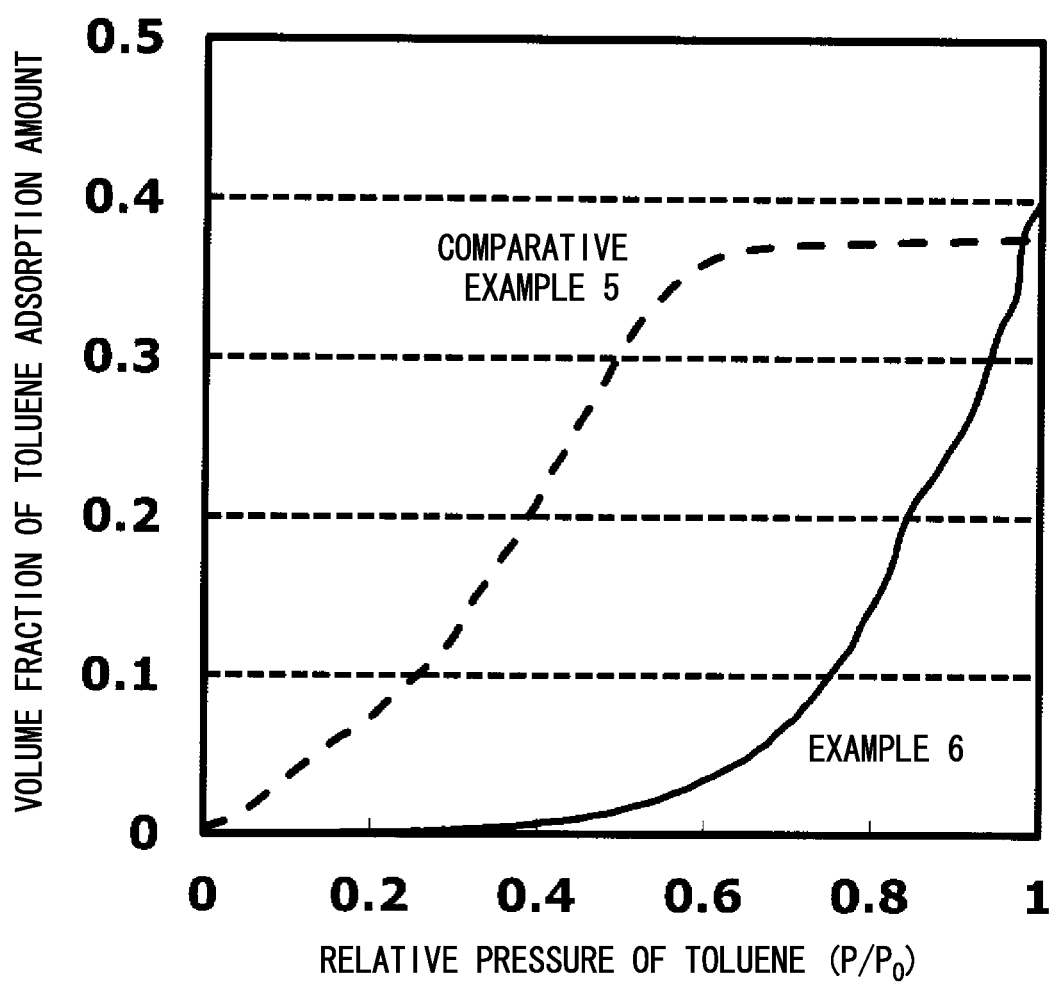
FIG. 4 is isothermal lines of toluene gas adsorption and desorption in Example 6 and Comparative Example 5.

The result of evaluation on the sealing property (isothermal line of toluene gas adsorption and desorption) in Example 6 is illustrated in FIG. 4.

As illustrated in FIG. 4, the sealing property with respect to the low-k film in Example 6, in which the branching degree of the polymer was 90%, was also excellent in the same manner as in other Examples.

As described above, it is confirmed that the sealing layer in Example 6 exhibits excellent sealing property with respect to the low-k film in spite of the fact that the thickness thereof is significantly thin to be 4.0 nm.

The disclosure of Japanese Patent Application No. 2012-007151 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A sealing composition for a semiconductor, comprising a polymer that includes two or more cationic functional groups including at least one of a tertiary nitrogen atom or a quaternary nitrogen atom, that has a weight average molecular weight of from 20,000 to 1,000,000, and that has a branching degree of 48% or more, wherein the polymer includes primary nitrogen atoms, and a proportion of the primary nitrogen atoms to all the nitrogen atoms in the polymer is 33% by mole or more, and wherein a content of sodium and a content of potassium in the sealing composition are each 10 ppb by weight or less on an element basis.

2. The sealing composition for a semiconductor according to claim 1, wherein the polymer includes a structural unit that is derived from an alkyleneimine having from 2 to 8 carbon atoms and that includes a tertiary nitrogen atom as a cationic functional group.

3. The sealing composition for a semiconductor according to claim 2, wherein the polymer further includes a structural unit that is derived from an alkyleneimine having from 2 to 8 carbon atoms and that includes a secondary nitrogen atom as a cationic functional group.

4. The sealing composition for a semiconductor according to claim 1, wherein the branching degree of the polymer is 55% or more.

5. The sealing composition for a semiconductor according to claim 1, wherein the sealing composition has an average particle diameter measured by a dynamic light scattering method of 150 nm or less.

6. The sealing composition for a semiconductor according to claim 1, wherein the polymer is a polyethyleneimine or a derivative of a polyethyleneimine.

7. The sealing composition for a semiconductor according to claim 1, wherein the polymer has a cationic functional group equivalent of from 27 to 430.

8. A method of producing a semiconductor device, comprising a sealing composition application process of applying the sealing composition for a semiconductor according to claim 1 to an interlayer dielectric layer formed on a substrate.

9. The method of producing a semiconductor device according to claim 8, wherein the interlayer dielectric layer includes a porous silica and has a silanol residue derived from the porous silica on a surface thereof.

10. The method of producing a semiconductor device according to claim 8, the method further comprising a process of forming a concave groove having a width of from 10 nm to 32 nm in the interlayer dielectric layer, wherein the sealing composition application process includes bringing the sealing composition for a semiconductor into contact with the interlayer dielectric layer at at least a side surface of the concave groove.

11. A semiconductor device comprising a structure in which:
an interlayer dielectric layer;
a polymer layer containing a polymer that includes two or more cationic functional groups including at least one of a tertiary nitrogen atom or a quaternary nitrogen atom, that has a weight average molecular weight of from 2,000 to 600,000, and that has a branching degree of 48% or more, wherein the polymer includes primary nitrogen atoms, and a proportion of the primary nitrogen atoms to all the nitrogen atoms in the polymer is 33% by mole or more; and
a layer including copper are disposed in this order.

12. A polymer that comprises two or more cationic functional groups including at least one of a tertiary nitrogen atom or a quaternary nitrogen atom, that has a weight average molecular weight of from 20,000 to 1,000,000, and that has a branching degree of 48% or more, wherein the polymer includes primary nitrogen atoms and secondary nitrogen atoms, and a proportion of the primary nitrogen atoms to all the nitrogen atoms in the polymer is 33% by mole or more.

13. The polymer according to claim 12, wherein the polymer is a polyethyleneimine or a derivative of a polyethyleneimine.

14. A method of producing the polymer according to claim 12, the method comprising a process of reacting a raw material polymer containing a secondary nitrogen atom with a compound represented by the following Formula (m-1):

wherein, in Formula (m-1), R represents a protective group, and n represents an integer from 1 to 4.

15. The method of producing a semiconductor device according to claim 8, wherein the interlayer dielectric layer has a porous structure, and a pore radius of the interlayer dielectric layer is from 0.5 nm to 4.0 nm.

16. A method of producing a semiconductor device, comprising a sealing composition application process of applying a sealing composition for a semiconductor to an interlayer dielectric layer formed on a substrate,
the sealing composition comprising a polymer that includes two or more cationic functional groups including at least one of a tertiary nitrogen atom or a quaternary nitrogen atom, that has a weight average molecular weight of from 2,000 to 1,000,000, and that has a branching degree of 48% or more, wherein a content of sodium and a content of potassium in the sealing composition are each 10 ppb by weight or less on an element basis,
the interlayer dielectric layer having a porous structure, and
a pore radius of the interlayer dielectric layer being from 0.5 nm to 4.0 nm.

* * * * *